ис011086230B2

(12) United States Patent
Hsu et al.

(10) Patent No.: US 11,086,230 B2
(45) Date of Patent: Aug. 10, 2021

(54) METHOD AND APPARATUS FOR SOURCE MASK OPTIMIZATION CONFIGURED TO INCREASE SCANNER THROUGHPUT FOR A PATTERNING PROCESS

(71) Applicant: ASML NETHERLANDS B.V., Veldhoven (NL)

(72) Inventors: Duan-Fu Stephen Hsu, Fremont, CA (US); Jingjing Liu, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/777,941

(22) Filed: Jan. 31, 2020

(65) Prior Publication Data
US 2020/0249578 A1  Aug. 6, 2020

Related U.S. Application Data

(60) Provisional application No. 62/799,837, filed on Feb. 1, 2019.

(51) Int. Cl.
*G03F 7/20* (2006.01)

(52) U.S. Cl.
CPC .......... *G03F 7/705* (2013.01); *G03F 7/70066* (2013.01); *G03F 7/70091* (2013.01);
(Continued)

(58) Field of Classification Search
CPC .. G03F 7/705; G03F 7/70441; G03F 7/70625; G03F 7/70091; G03F 7/70066;
(Continued)

(56) References Cited

U.S. PATENT DOCUMENTS

| 5,229,872 A | 7/1993 | Mumola |
| 6,046,792 A | 4/2000 | Van Der Werf et al. |

(Continued)

OTHER PUBLICATIONS

Liu, Xiaofeng et al.: "EUV source-mask optimization for 7nm node and beyond", Proc. of SPIE, vol. 9048, Apr. 17, 2014.
(Continued)

*Primary Examiner* — Christina A Riddle
(74) *Attorney, Agent, or Firm* — Pillsbury Winthrop Shaw Pittman LLP

(57) ABSTRACT

A method for optimization to increase lithographic apparatus throughput for a patterning process is described. The method includes providing a baseline dose for an EUV illumination and an initial pupil configuration, associated with a lithographic apparatus. The baseline dose and the initial pupil configuration are configured for use with a dose anchor mask pattern and a corresponding dose anchor target pattern for setting an illumination dose for corresponding device patterns of interest. The method includes biasing the dose anchor mask pattern relative to the dose anchor target pattern; determining an acceptable lower dose for the biased dose anchor mask pattern and the initial pupil configuration; unbiasing the dose anchor mask pattern relative to the dose anchor target pattern; and determining a changed pupil configuration and a mask bias for the device patterns of interest based on the acceptable lower dose and the unbiased dose anchor mask pattern.

22 Claims, 11 Drawing Sheets

(52) U.S. Cl.
CPC ...... *G03F 7/70433* (2013.01); *G03F 7/70441* (2013.01); *G03F 7/70558* (2013.01); *G03F 7/70625* (2013.01)

(58) Field of Classification Search
CPC .. G03F 7/70433; G03F 7/702; G03F 7/70033; G03F 7/70325; G03F 7/70483; G03F 7/70491; G03F 7/70508; G03F 7/70516; G03F 7/7055; G03F 7/70558; G03F 7/70616; G03F 7/70633; G03F 7/70641; G03F 7/70675; G03F 1/36; G03F 1/22; G03F 1/38; G03F 1/44; G03F 1/68; G03F 1/70
USPC ...... 355/52–55, 67–71, 77; 430/5, 8, 22, 30, 430/311; 716/50–53, 55; 250/492.1, 250/492.2, 492.22, 493.1, 503.1, 504 R
See application file for complete search history.

(56) References Cited

U.S. PATENT DOCUMENTS

| | | |
|---|---|---|
| 7,587,704 B2 | 9/2009 | Ye et al. |
| 9,588,438 B2 | 3/2017 | Hsu et al. |
| 10,025,201 B2 | 7/2018 | Hsu et al. |
| 2007/0031745 A1 | 2/2007 | Ye et al. |
| 2007/0050749 A1 | 3/2007 | Ye et al. |
| 2008/0092106 A1* | 4/2008 | Hsu ............ G03F 1/70 716/53 |
| 2008/0301620 A1 | 12/2008 | Ye et al. |
| 2008/0309897 A1 | 12/2008 | Wong et al. |
| 2009/0157360 A1 | 6/2009 | Ye et al. |
| 2010/0005440 A1* | 1/2010 | Viswanathan ............ G03F 1/68 716/53 |
| 2010/0082313 A1* | 4/2010 | Tejnil ............ G03F 7/705 703/12 |
| 2010/0162197 A1 | 6/2010 | Ye et al. |
| 2010/0180251 A1 | 7/2010 | Ye et al. |
| 2014/0282291 A1* | 9/2014 | Inoue ............ G03F 7/70125 716/52 |
| 2015/0378262 A1 | 12/2015 | Liu et al. |
| 2018/0259858 A1* | 9/2018 | Chen ............ G03F 7/70633 |
| 2018/0348641 A1* | 12/2018 | Kim ............ G03F 7/70641 |

OTHER PUBLICATIONS

Hsu, Stephen et al.: "EUV resolution enhancement techniques (RETs) for k1 0.4 and below", Proc. of SPIE, vol. 9422, Mar. 16, 2015.

Stover, Harry. "Near-Term Case for 5x Versus 10x Wafer Steppers", Proc. of SPIE, vol. 0334, Sep. 13, 1982.

* cited by examiner

METHOD AND APPARATUS FOR SOURCE MASK OPTIMIZATION CONFIGURED TO INCREASE SCANNER THROUGHPUT FOR A PATTERNING PROCESS

This application claims the benefit of priority of U.S. patent application No. 62/799,837, filed on Feb. 1, 2019 and which is incorporated herein in its entirety by reference.

TECHNICAL FIELD

The present description relates generally to improving and optimizing lithography processes. More particularly, apparatus, methods, and computer programs for illumination/source mask optimization configured to increase lithographic apparatus throughput are described.

BACKGROUND

A lithographic projection apparatus can be used, for example, in the manufacture of integrated circuits (ICs). In such a case, a patterning device (e.g., a mask) may contain or provide a pattern corresponding to an individual layer of the IC ("design layout"). This pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatus, the pattern on the entire patterning device is transferred onto one target portion in one operation. Such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), and the reduction ratio can be different in x and y direction features the speed F at which the substrate is moved will be 1/M times that at which the projection beam scans the patterning device. More information with regard to lithographic devices as described herein can be gleaned, for example, from U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source apparatus, creating individual functional elements having dimensions well below 100 nm, i.e. less than half the wavelength of the radiation from the illumination source apparatus (e.g., a 193 nm illumination source apparatus).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source apparatus before the radiation passes the patterning device, and/or optical components for shaping, adjusting and/or projecting the radiation after the radiation passes the patterning device. The projection optics generally exclude the source apparatus and the patterning device.

SUMMARY

According to an embodiment, there is provided a method for configuring an extreme ultra violet (EUV) lithographic apparatus. The method comprises providing a baseline dose for an EUV illumination/source and an initial pupil configuration. The baseline dose and the initial pupil configuration are configured for use with a dose anchor mask pattern and a corresponding dose anchor target pattern for setting an illumination dose for corresponding device patterns of interest. The method comprises biasing the dose anchor mask pattern relative to the dose anchor target pattern. The method comprises determining an acceptable lower dose for the biased dose anchor mask pattern and the initial pupil configuration. The method comprises unbiasing the dose anchor mask pattern relative to the dose anchor target pattern; and determining a changed pupil configuration and a mask bias for the device patterns of interest based on the acceptable lower dose and the unbiased dose anchor mask pattern (e.g., unbiased back to its original dimensional position).

In an embodiment, biasing the dose anchor mask pattern relative to the dose anchor target pattern comprises dimensionally shifting the dose anchor mask pattern relative to the dose anchor target pattern in one or more dimensions to ensure the dose anchor target pattern is printed with a correct critical dimension (CD) and pattern placement.

In an embodiment, biasing the dose anchor mask pattern relative to the dose anchor target pattern comprises dimensionally shifting one or more edges of one or more features of the dose anchor mask pattern.

In an embodiment, the one or more features of the dose anchor mask pattern are one dimensional or two dimensional.

In an embodiment, biasing the dose anchor mask pattern relative to the dose anchor target pattern is symmetrical or asymmetrical.

In an embodiment, biasing the dose anchor mask pattern relative to the dose anchor target pattern comprises enlarging one or more device patterns and a corresponding mask bias of the device patterns of interest.

In an embodiment, determining the acceptable lower dose for the biased dose anchor mask pattern and the initial pupil configuration comprises a dose and focus optimization.

In an embodiment, providing the baseline dose for the EUV pupil and the initial pupil configuration comprises: optimizing a freeform or parametric pupil and the dose anchor mask pattern; optimizing a continuous transmission mask (CTM) and extracting main and assist features; optimizing pupil and polygon masks at different dose levels; converting a discrete pupil; performing a dose and focus optimization; determining the baseline dose and the initial pupil configuration based on the dose and focus optimization; and providing the baseline dose for the EUV illumination and the initial pupil configuration.

In an embodiment, the method further comprises, after determining the changed pupil configuration and the mask bias for the device patterns of interest: performing a discrete mirror state optimization at the acceptable lower dose, or a higher dose; optimizing the acceptable lower dose based on a difference between Abbe and Hopkins model outputs; optimizing the mask bias for the device patterns of interest through slits using the optimized acceptable lower dose, or the higher dose; and determining scanner throughput based on the optimized acceptable lower dose and a relative scanner throughput model.

In an embodiment, the method further comprises, after determining the changed pupil configuration based on the acceptable lower dose, or the higher dose, and the unbiased dose anchor mask pattern: normalizing an intensity of the EUV illumination to optimize a free form illumination mask co-optimization with a fixed dose and a fixed illumination intensity set at the acceptable lower dose, or the higher dose, with a pupil telecentricity penalty; a continuous pupil produced by the changed pupil configuration to a discrete pupil; performing a dose and focus optimization using a dose anchor feature and a focus anchor feature, simultaneously or sequentially; performing a mask only optimization of the device patterns of interest with the discrete pupil at the acceptable lower dose; optimizing the acceptable lower dose based on a difference between Abbe and Hopkins model outputs; optimizing the mask bias for the device patterns of interest through slits using the optimized acceptable lower dose or a higher dose; and determining scanner throughput based on the optimized acceptable lower dose and a relative scanner throughput model.

In an embodiment, providing the baseline dose for the EUV illumination and the initial pupil configuration, biasing the dose anchor mask pattern relative to the dose anchor target pattern, determining the acceptable lower dose for the biased dose anchor mask pattern and the initial pupil configuration, unbiasing the dose anchor mask pattern relative to the dose anchor target pattern, and determining the changed pupil configuration and the mask bias for the device patterns of interest based on the acceptable lower dose and the unbiased dose anchor mask pattern are performed for an aerial image model.

In an embodiment, providing the baseline dose for the EUV illumination and the initial pupil configuration, biasing the dose anchor mask pattern relative to the dose anchor target pattern; determining the acceptable lower dose for the biased dose anchor mask pattern and the initial pupil configuration; unbiasing the dose anchor mask pattern relative to the dose anchor target pattern; and determining the changed pupil configuration and the mask bias for the device patterns of interest based on the acceptable lower dose and the unbiased dose anchor mask pattern are performed for a resist model. The resist model can be a calibrated resist model or full physically resist model.

In an embodiment, providing the baseline dose for the EUV illumination and the initial pupil configuration, biasing the dose anchor mask pattern relative to the dose anchor target pattern, determining the acceptable lower dose for the biased dose anchor mask pattern and the initial pupil configuration, unbiasing the dose anchor mask pattern relative to the dose anchor target pattern, and determining the changed pupil configuration and the mask bias for the device patterns of interest based on the acceptable lower dose and the unbiased dose anchor mask pattern are performed at any numerical aperture and/or wavelength.

In an embodiment, providing the baseline dose for the EUV illumination and the initial pupil configuration, biasing the dose anchor mask pattern relative to the dose anchor target pattern, determining the acceptable lower dose for the biased dose anchor mask pattern and the initial pupil configuration, unbiasing the dose anchor mask pattern relative to the dose anchor target pattern, and determining the changed pupil configuration and the mask bias for the device patterns of interest based on the acceptable lower dose and the unbiased dose anchor mask pattern are performed as part of a memory chip, logic chip, and/or microprocessor chip fabrication process.

In an embodiment, providing the baseline dose for the EUV illumination and the initial pupil configuration, biasing the dose anchor mask pattern relative to the dose anchor target pattern, determining the acceptable lower dose for the biased dose anchor mask pattern and the initial pupil configuration, unbiasing the dose anchor mask pattern relative to the dose anchor target pattern, and determining the changed pupil configuration and the mask bias for the device patterns of interest based on the acceptable lower dose and the unbiased dose anchor mask pattern are performed as part of an illumination mask optimization (SMO) process.

In an embodiment, biasing the dose anchor mask pattern relative to the dose anchor target pattern, determining the acceptable lower dose for the biased dose anchor mask pattern and the initial pupil configuration, unbiasing the dose anchor mask pattern relative to the dose anchor target pattern, and determining the changed pupil configuration and the mask bias for the device patterns of interest based on the acceptable lower dose and the unbiased dose anchor mask pattern are performed such that a performance parameter is maintained at an acceptable level.

In an embodiment, the performance parameter is one or more of normalized image long slope (NILS), depth of focus (DOF), line edge roughness (LER), local CD uniformity (LCDU) or stochastic edge placement error (SEPE).

In an embodiment, the method further comprises determining a scanner throughput for a scanner associated with the EUV lithographic apparatus.

In an embodiment, the scanner throughput is determined based on a relative throughput model comprising one or more machine specific constants, a transmission penalty, an illumination/source power, the acceptable lower or a higher dose, the baseline dose, and a relative change between the baseline dose and the acceptable lower dose, or a higher dose. For an aerial image model, for example, the dose=1/threshold.

In an embodiment, the baseline dose and the initial pupil configuration are configured for use with the dose anchor mask pattern and the corresponding dose anchor target pattern for setting the illumination dose for corresponding optimized device patterns of interest.

According to another embodiment, there is provided a computer program product comprising a non-transitory computer readable medium having instructions recorded thereon, the instructions when executed by a computer implementing the method described above.

DETAILED DESCRIPTION

Figure 1:
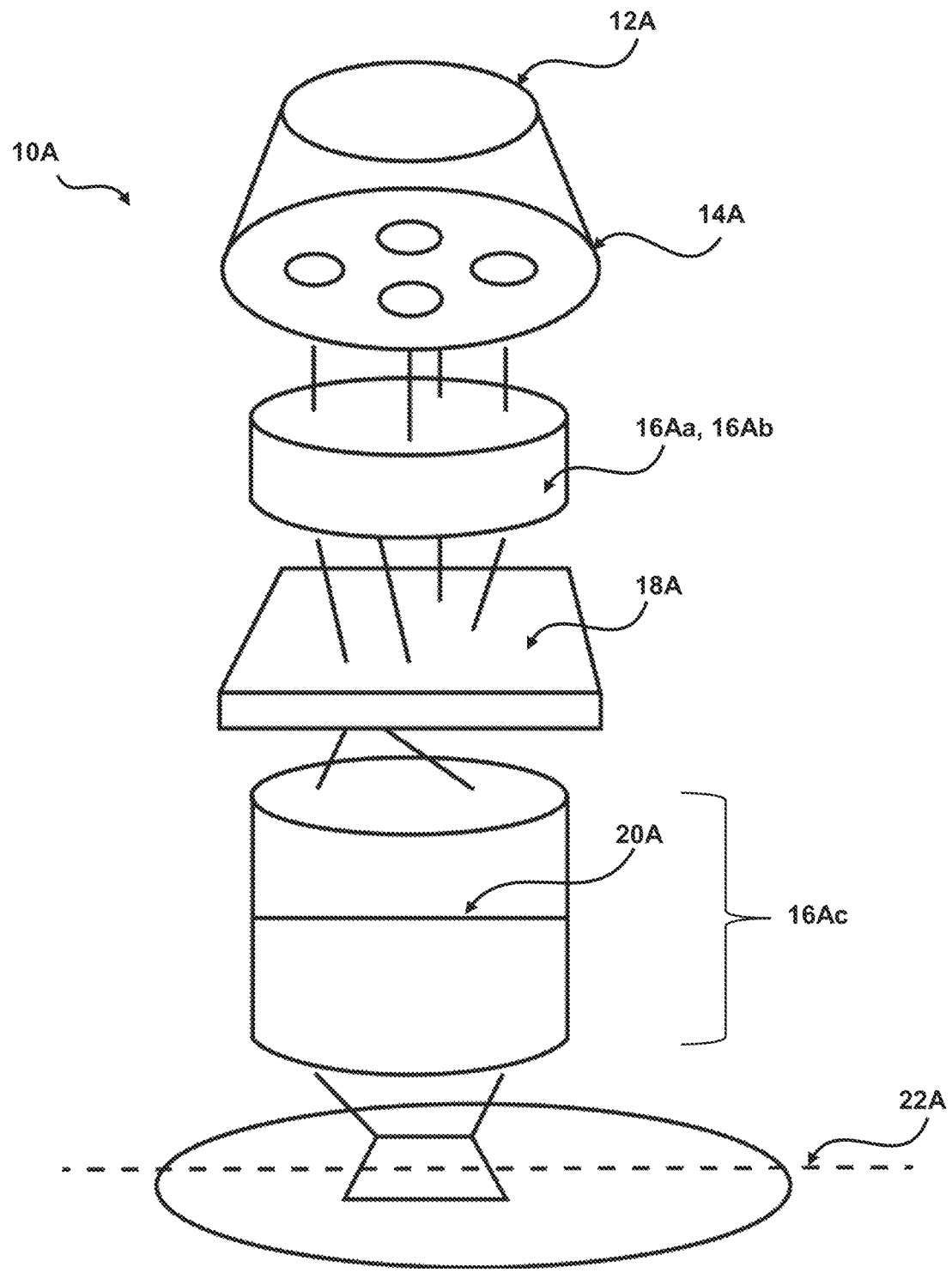
FIG. 1 shows a block diagram of various subsystems of a lithography system.

The illumination exposure dose impacts scanner throughput for imaging operations related to extreme ultraviolet (EUV) patterning processes. For example, a higher dose correlates with lower lithographic apparatus/scanner throughput. Lithographic apparatus throughput is measured in units of substrate per hour, for example. As such, the exposure dose is a significant factor to consider during illumination (source) mask optimization (SMO) and/or other operations. If the dose can be decreased, lithographic apparatus throughput may also be increased, and the overall manufacturing turn-around time (TAT) and/or costs for a manufacturing a substrate may be reduced. During typical SMO the illumination intensity and dose are confounded. The dose (e.g., in energy per unit area or $mj/cm^2$) is not considered separately. Currently there is believed to be no SMO method configured to reduce the illumination exposure dose and increase lithographic apparatus throughput.

To handle real device design and large clip sizes, typical industry level SMO uses a compact model for computation efficiency. However, the compact model requires substrate (wafer) data for model calibration at a given dose from the substrate exposure in the fab (e.g., the manufacturing floor), which is often not available during SMO. An anchor target pattern and a corresponding anchor mask pattern in SMO is used as a vehicle for correlating the dose (or threshold, for an optical model the dose=1/threshold) to the physical dose in an actual substrate exposure. The higher the exposure dose the lower the lithographic apparatus throughput.

In existing methods, the center of an EUV anchor mask pattern is aligned and fixed to the center of an anchor target pattern. However, a shadow effect between the anchor mask and the anchor target induces a high edge placement error (EPE) and limits illumination mask optimization for substrate layer patterns. This is not an issue in deep ultra violet (DUV) patterning processes, or for vertical anchor target patterns, for example. However, horizontal and/or other anchor patterns in EUV patterning processes may be significantly shifted (from an intended target pattern position) at nominal conditions because the patterns have a different optimal anchor mask position compared to an original design intended position. This can lead to device functional issues. Electrical contacts and/or other features may be misaligned from one substrate layer to another (e.g., because features may be shifted relative to their intended position in a target pattern), for example.

Allowing the anchor mask pattern to shift relative to the anchor target pattern (or intentionally shifting or biasing the anchor mask pattern relative to the anchor target pattern) while keeping its critical dimension (CD) constant reduces the EPE described above, and restores target features to their intended positions in the anchor target pattern (e.g., compared to a fixed mask/target relationship). Thus, a method that provides CD-only anchoring as well as specifying an (asymmetric or symmetric) anchor mask bias would be advantageous.

The present apparatus and method bias the anchor mask relative to an anchor target (while keeping a CD constant) and include setting a lower illumination exposure dose (relative to a dose that would be determined with the anchor mask (pattern) and the anchor target (pattern) aligned with each other). The anchor mask is then unbiased (e.g., realigned with the anchor target, or put back to its original dimensional position) and a pupil is optimized for the lower dose and SMO continues using the lower dose. This is a new dose reduction SMO method that is able to maintain typical normalized image log slope (NILS), EPE, and/or other values. This method is applicable to aerial images and resist models, for example. This method is applicable for any numerical aperture (NA) and/or wavelength. This method is applicable to any chip design (e.g., memory chips, logic chips, microprocessor chips, and/or other chips).

Although specific reference may be made in this text to the manufacture of ICs, it should be understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass EUV (extreme ultra-violet radiation, e.g. having a wavelength in the range of about 3-100 nm) radiation. However, other applications of the present method with other types of electromagnetic radiation, including ultraviolet radiation (e.g. with a wavelength of 365, 248, 193, 157 or 126 nm), is contemplated.

A patterning device can comprise, or can form, one or more design layouts. The design layout can be generated utilizing CAD (computer-aided design) programs. This process is often referred to as EDA (electronic design automation). Most CAD programs follow a set of predetermined design rules in order to create functional design layouts/patterning devices. These rules are set based processing and design limitations. For example, design rules define the space tolerance between devices (such as gates, capacitors, etc.) or interconnect lines, to ensure that the devices or lines do not interact with one another in an undesirable way. One or more of the design rule limitations may be referred to as a "critical dimension" (CD). A critical dimension of a device can be defined as the smallest width of a line or hole, or the smallest space between two lines or two holes. Thus, the CD regulates the overall size and density of the designed device. One of the goals in device fabrication is to faithfully reproduce the original design intent on the substrate (via the patterning device).

The term "mask", "reticle" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective; binary, phase-shifting, hybrid, etc.), examples of other such patterning devices include a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. Examples of other such patterning devices also include a programmable LCD array. An example of such a construction is given in U.S. Pat. No. 5,229,872, which is incorporated herein by reference.

As a brief introduction, FIG. 1 illustrates an exemplary lithographic projection apparatus 10A. Major components are a radiation source apparatus 12A, which may be an extreme ultra violet (EUV) source apparatus or another type of source apparatus (as discussed above, the lithographic projection apparatus itself need not have the radiation source apparatus), illumination optics which, for example, define the partial coherence (denoted as sigma) and which may include optics 14A, 16Aa and 16Ab that shape radiation from the source apparatus 12A; a patterning device (or mask) 18A; and transmission optics 16Ac that project an image of the patterning device pattern onto a substrate plane 22A.

A pupil 20A can be included with transmission optics 16Ac. In some embodiments, there can be one or more pupils before and/or after mask 18A. As described in further detail herein, pupil 20A can provide patterning of the light that ultimately reaches substrate plane 22A. An adjustable filter or aperture at the pupil plane of the projection optics may restrict the range of beam angles that impinge on the substrate plane 22A, where the largest possible angle defines the numerical aperture of the projection optics NA=n sin ($\theta_{max}$), wherein n is the refractive index of the media between the substrate and the last element of the projection optics, and $\theta_{max}$ is the largest angle of the beam exiting from the projection optics that can still impinge on the substrate plane 22A.

In a lithographic projection apparatus, a source apparatus provides illumination (i.e. radiation) to a patterning device and projection optics direct and shape the illumination, via the patterning device, onto a substrate. The projection optics may include at least some of the components 14A, 16Aa, 16Ab and 16Ac. An aerial image (AI) is the radiation intensity distribution at substrate level. A resist model can be used to calculate the resist image from the aerial image, an example of which can be found in U.S. Patent Application Publication No. US 2009-0157630, the disclosure of which is hereby incorporated by reference in its entirety. The resist model is related only to properties of the resist layer (e.g., effects of chemical processes that occur during exposure, post-exposure bake (PEB) and development). Optical properties of the lithographic projection apparatus (e.g., properties of the illumination, the patterning device and the projection optics) dictate the aerial image and can be defined in an optical model. Since the patterning device used in the lithographic projection apparatus can be changed, it is desirable to separate the optical properties of the patterning device from the optical properties of the rest of the lithographic projection apparatus including at least the source apparatus and the projection optics. Details of techniques and models used to transform a design layout into various lithographic images (e.g., an aerial image, a resist image, etc.), applying OPC using those techniques and models, and evaluating performance (e.g., in terms of process window) are described in U.S. Patent Application Publication Nos. US 2008-0301620, 2007-0050749, 2007-0031745, 2008-0309897, 2010-0162197, and 2010-0180251, the disclosure of each being hereby incorporated by reference in its entirety.

One aspect of understanding a lithographic process is understanding the interaction of the radiation and the patterning device. The electromagnetic field of the radiation after the radiation passes the patterning device may be determined from the electromagnetic field of the radiation before the radiation reaches the patterning device and a function that characterizes the interaction. This function may be referred to as the mask transmission function (which can be used to describe the interaction by a transmissive patterning device and/or a reflective patterning device).

The mask transmission function may have a variety of different forms. One form is binary. A binary mask transmission function has either of two values (e.g., zero and a positive constant) at any given location on the patterning device. A mask transmission function in the binary form may be referred to as a binary mask. Another form is continuous. Namely, the modulus of the transmittance (or reflectance) of the patterning device is a continuous function of the location on the patterning device. The phase of the transmittance (or reflectance) may also be a continuous function of the location on the patterning device. A mask transmission function in the continuous form may be referred to as a continuous tone mask or a continuous transmission mask (CTM). For example, the CTM may be represented as a pixelated image, where each pixel may be assigned a value between 0 and 1 (e.g., 0.1, 0.2, 0.3, etc.) instead of binary value of either 0 or 1. In an embodiment, CTM may be a pixelated gray scale image, with each pixel having values (e.g., within a range [−255, 255], normalized values within a range [0, 1] or [−1, 1] or other appropriate ranges).

The thin-mask approximation, also called the Kirchhoff boundary condition, is widely used to simplify the determination of the interaction of the radiation and the patterning device. The thin-mask approximation assumes that the thickness of the structures on the patterning device is very small compared with the wavelength and that the widths of the structures on the mask are very large compared with the wavelength. Therefore, the thin-mask approximation assumes the electromagnetic field after the patterning device is the multiplication of the incident electromagnetic field with the mask transmission function. However, as lithographic processes use radiation of shorter and shorter wavelengths, and the structures on the patterning device become smaller and smaller, the assumption of the thin-mask approximation can break down. For example, interaction of the radiation with the structures (e.g., edges between the top surface and a sidewall) because of their finite thicknesses ("mask 3D effect" or "M3D") may become significant. Encompassing this scattering in the mask transmission function may enable the mask transmission function to better capture the interaction of the radiation with the patterning device. A mask transmission function under the thin-mask approximation may be referred to as a thin-mask transmission function. A mask transmission function encompassing M3D may be referred to as a M3D mask transmission function.

Figure 2:
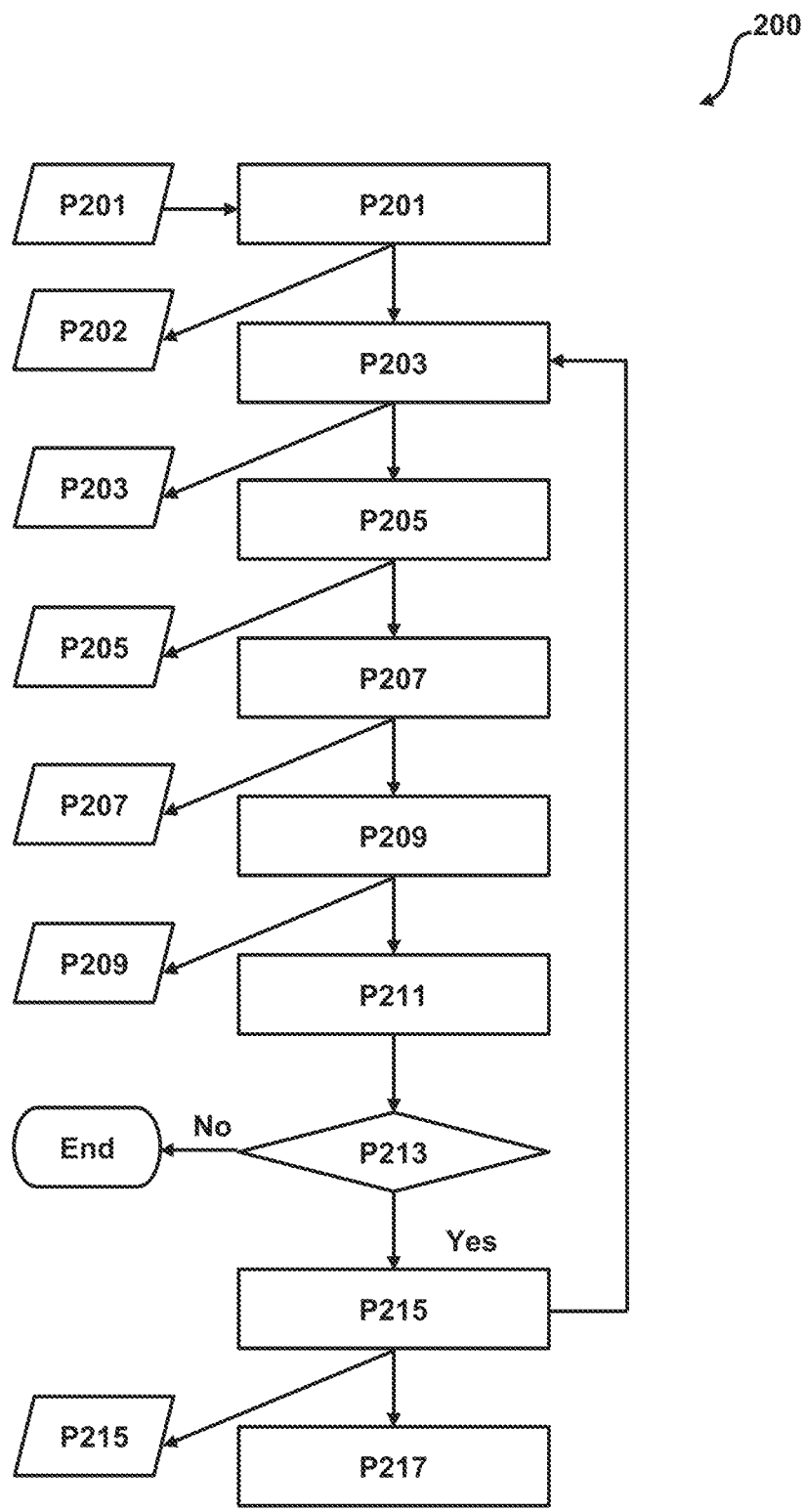
FIG. 2 is flow chart of a method for determining a patterning device pattern or a target pattern to be printed on a substrate, according to an embodiment.

FIG. 2 is flow chart of a method 200 for determining a patterning device pattern (or mask pattern, hereinafter) from an image (e.g., continuous transmission mask image, a binary mask image, a curvilinear mask image, etc.) corresponding to a target pattern to be printed on a substrate via a patterning process involving a lithographic process. In an embodiment, the design layout or the target pattern may be a binary design layout, a continuous tone design layout, or a design layout of another suitable form.

The method 200 is an iterative process, where an initial image (e.g., enhanced image, mask variables initialized from a CTM image, etc.) is progressively modified to generate different types of images according to different processes of the present disclosure to eventually generate information comprising mask patterns or an image (e.g., mask variables corresponding to a final curvilinear mask) further used to fabricate/manufacture a mask. The iterative modification of the initial image may be based on a cost function, where during an iteration the initial image may be modified such that the cost function is reduced, in an embodiment, minimized. In an embodiment, the method 200 may also be referred to as a binarized CTM process, where an initial image is an optimized CTM image which is further processed according to the present disclosure to generate a curvilinear mask pattern (e.g., geometrical or polygonal representation shape of a curvilinear mask or curvilinear pattern). In an embodiment, the initial image may be the enhanced image of the CTM image. The curvilinear mask pattern may be in the form of a vector, a table, mathematical equations, or other form of representing geometric/polygonal shapes.

In an embodiment, process P201 may involve obtaining an initial image (e.g., a CTM image or an optimized CTM image, or a binary mask image). In an embodiment, initial image 201 may be a CTM image generated by a CTM generation process based on a target pattern to be printed on a substrate. The CTM image may then be received by the process P201. In an embodiment, the process P201 may be configured to generate a CTM image. For example, in a CTM generation technique, an inverse lithography problem is formulated as an optimization problem. The variables are related to values of pixels in a mask image, and lithography metric such as EPE or sidelobe printings are used as cost function. In an iteration of the optimization, the mask image is constructed from the variables and then a process model (e.g., Tachyon model) is applied to obtain optical or resist images and cost functions are computed. The cost computation then gives the gradient values that are used in the optimization solver to update variables (e.g., pixel intensities). After several iterations during optimization, a final mask image is generated, which is further used as guidance map for pattern extraction (e.g., as implemented in Tachyon SMO software). Such an initial image (e.g., the CTM image) may include one or more features (e.g., a feature of a target pattern, SRAFs, SRIFs, etc.) corresponding to the target pattern to be printed on the substrate via the patterning process.

In an embodiment, the CTM image (or an enhanced version of the CTM image) may be used to initialize the mask variables that can be used as the initial image 201, which is iteratively modified as discussed below.

The process P201 may involve generating an enhanced image 202 based on the initial image 201. An enhanced image 202 may be an image where certain selected pixels within the initial image 201 are amplified. The selected pixels may be pixels having relatively lower values (or weak signals) within the initial image 201. In an embodiment, the selected pixels be pixels have signal values lower than, for example, an average intensity of pixels throughout the initial image, or a given threshold value. In other words, pixels with weaker signals within the initial image 201 are amplified, thus enhancing one or more features within the initial image 201. For example, a second order SRAFs around a target feature may have a weak signal that may be amplified. Thus, the enhanced image 202 may highlight or identify additional features (or structures) that may be included within a mask image (generated later on in the method). In a conventional method (e.g., CTM method) of determining a mask image, weak signals within an initial image may be ignored and as such, the mask image may not include features that may be formed from a weak signal in an initial image 201.

The generation of the enhanced image 202 involves applying an image processing operation such as a filter (e.g., an edge detection filter) to amplify weak signals within the initial image 201. Alternatively, or in addition, the image processing operation may be deblurring, averaging, and/or feature extraction or other similar operations. Examples of the edge detection filter include the Prewitt operator, Laplacian operator, Laplacian of Gaussian (LoG) filter, etc. The generation step may further involve combining the amplified signals of the initial image 201 with original signals of the initial image 201 with or without modifying the original strong signals of the initial image 201. For example, in an embodiment, for one or more pixel values at one or more locations (e.g., at contact holes) across the initial image 201, the original signal may be relatively strong (e.g., above a certain threshold such as 150 or below −50), then the original signal at the one or more locations (e.g., at contact holes) may not be modified or combined with the amplified signal for that location.

In an embodiment, noise (e.g., random variation in brightness or color or pixel values) in the initial image 201 may also be amplified. So, alternatively or in addition, a smoothing process may be applied to reduce noise (e.g., random variation in brightness or color or pixel values) in the combined image. Examples of image smoothing methods include Gaussian blur, running average, low-pass filters, etc.

In an embodiment, the enhanced image 202 may be generated using an edge detection filter. For example, an edge detection filter may be applied to the initial image 201 to generate a filtered image that highlights edges of one or more features within an initial image 201. The resulting filtered image may be further combined with the original image (i.e., the initial image 201) to generate the enhanced image 202. In an embodiment, the combining of the initial image 201 and the image obtained after edge filtering may involve modifying only those parts of the initial image 201 that have weak signals without modifying the regions having strong signals, and the combining process could be weighted based on signal strength. In an embodiment, amplifying of the weak signal may also amplify noise within the filtered image. Hence, according to an embodiment, a smoothing process may be performed on the combined image. A smoothing of an image may refer to an approximating function that attempts to capture important patterns (e.g., target pattern, SRAFs) in the image, while leaving out noise or other fine-scale structures/rapid phenomena. In smoothing, the data points of a signal may be modified so individual points (presumably because of noise) may be reduced, and points that may be lower than the adjacent points may be increased leading to a smoother signal or a smoother image. Thus, upon smoothing operation, the further smooth version of the enhanced image 202 having reduced noise may be obtained, according to an embodiment of the present disclosure.

The method, in process P203 may involve generating mask variables 203 based on the enhanced image 202. In a first iteration, the enhanced image 202 may be used to initialize the mask variables 203. In later iterations the mask variables 203 may be updated iteratively.

A contour extraction of a real-valued function $f$ of n real variables, is a set of the form:

$$L_c(f) = \{(x_1, x_2, \ldots x_n) / f(x_1, x_2, \ldots x_n) = c\}$$

In a two dimensional space, the set defines the points on the surface at which the function $f$ equals to given value c. In a two dimensional space, the function $f$ is able to extract a closed contour which will be rendered to the mask image.

In the above equation, $x_1, x_2, \ldots x_n$ refer to mask variables such as the intensity of an individual pixel, which determines the locations where the curvilinear mask edge exists with a given constant value c (e.g. a threshold plane as discussed in process P205 below).

In an embodiment, at an iteration, the generating of the mask variables 203 may involve modifying one or more values of variables (e.g., pixel values at one or more locations) within the enhanced image 202 based on, for example, initialization conditions or a gradient map (which may be generated later on in the method). For example, the one or more pixel values may be increased or decreased. In other words, the amplitude of one or more signals within the enhanced image 202 may be increased or decreased. Such modified amplitude of the signals enables generation of different curvilinear patterns depending on an amount of change in the amplitude of the signal. Thus, the curvilinear patterns gradually evolve until a cost function is reduced, in an embodiment, minimized. In an embodiment, further smoothing may be performed on the level mask variables 203.

Furthermore, process P205 involves generating curvilinear mask patterns 205 (e.g., having polygon shapes represented in a vector form) based on the mask variables 203. The generation of the curvilinear mask patterns 205 may involve thresholding of the mask variables 203 to trace or generate curvilinear (or curved) patterns from the mask variables 203. For example, thresholding may be performed using a threshold plane (e.g., an x-y plane) having a fixed value which intersects the signals of the mask variables 203. The intersection of the threshold plane with the signals of the mask variables 203 generate tracings or outlines (i.e., curved polygon shapes) which form polygonal shapes that serve as the curvilinear patterns for the curvilinear mask patterns 205. For example, the mask variables 203 may be intersected with the zero plane parallel to the (x,y) plane. Thus, the curvilinear mask patterns 205 may be any curvilinear patterns generated as above. In an embodiment, the curvilinear patterns traced or generated from the mask variables 203 depend on the signals of the enhanced image 202. As such, the image enhancement process P203 facilitates improvement in patterns generated for a final curvilinear mask pattern. The final curvilinear mask patterns may be further used by a mask manufacturer to fabricate a mask for use in a lithography process.

Process P207 may involve rendering the curvilinear mask patterns 205 to generate a mask image 207. Rendering is an operation performed on the curvilinear mask patterns, which is a similar process as converting rectangle mask polygons into discrete grayscale image representations. Such a process could be generally understood as sampling the box function of continuous coordinates (polygons) into values at each point of image pixels.

The method further involves a forward simulation of the patterning process using process models that generate or predict a pattern 209 that may be printed on a substrate based on the mask image 207. For example, process P209 may involve executing and/or simulating the process model using the mask image 207 as input and generating a process image 209 on the substrate (e.g., an aerial image, a resist image, etch image, etc.). In an embodiment, the process model may include a mask transmission model coupled to an optics model which is further coupled to a resist model and/or etch model. The output of the process model may be a process image 209 that has factored in different process variations during the simulation process. The process image may be further used to determine parameters (e.g., EPE, CD, overlay, sidelobe, etc.) of the patterning process by, for example, tracing the contours of the patterns within the process image. The parameters may be further used to define a cost function, which is further used to optimize the mask image 207 such that the cost function is reduced, or in an embodiment minimized.

In process P211, a cost function may be evaluated based on the process model image 209 (also referred as a simulated substrate image or substrate image or wafer image). Thus, the cost function may be considered as process aware, where variations of the patterning process, enabling generation of curvilinear mask patterns that account for variations in patterning process. For example, the cost function may be an edge placement error (EPE), sidelobe, a mean squared error (MSE), Pattern placement error(PPE), normalized image log or other appropriate variable defined based on the contour of the patterns in the process image. An EPE may be an edge placement error associated with one or more patterns and/or a summation of all the edge placement errors related to all the patterns of the process model image 209 and the corresponding target patterns. In an embodiment, the cost function may include more than one condition that may be simultaneously reduced or minimized. For example, in addition to the MRC violation probability, the number of defects, EPE, overlay, CD or other parameters may be included, and all the conditions may be simultaneously reduced (or minimized).

Furthermore, one or more gradient maps may be generated based on the cost function (e.g., EPE) and mask variables may be modified based on such gradient map(s). Mask variables (MV) refer to intensities of $\emptyset$. Accordingly, the gradient computation may be represented as $dEPE/d\emptyset$, and the gradient values are updated by capturing the inverse mathematical relationship from the mask image (MI) to curvilinear mask polygons to mask variables. Thus, a chain of derivatives may be computed of the cost function with respect to the mask image, from the mask image to curvilinear mask polygon, and from curvilinear mask polygon to mask variables, which allows modification of the values of the mask variables at the mask variables.

In an embodiment, image regularization may be added to reduce the complexity of the mask patterns that may be generated. Such image regularization may be mask rule checks (MRC). MRC refers to the limiting conditions of a mask manufacturing process or apparatus. Thus, the cost function may include different components, for example, based on EPE and MRC violation penalty. A penalty may be a term of the cost function that depends on a violation amount, e.g., a difference between a mask measurement and a given MRC or mask parameter (for example, a mask pattern width and an allowed (e.g., minimum or maximum) mask pattern width). Thus, according to an embodiment of the present disclosure, mask patterns may be designed, and a corresponding mask may be fabricated not only based on forward simulation of the patterning process, but also additionally based on manufacturing limitations of the mask manufacturing apparatus/process. Thus, a manufacturable curvilinear mask producing high yield (i.e., minimum defects) and high accuracy in terms of, for example, EPE or overlay on the printed pattern may be obtained.

The pattern corresponding to a process image should be exactly the same as the target pattern, however, such exact target patterns may not feasible (for example, typically sharp corners) and some conflictions are introduced due to the variations in the patterning process itself and/or approximations in the models of the patterning process. In a first iteration of the method, the mask image 207 may not generate a pattern (in the resist image) which is similar to the target pattern. The determination of accuracy or acceptance of the printed pattern in the resist image (or etch image) may be based on the cost function such as EPE. For example, if the EPE of the resist pattern is high, it indicates that the printed pattern using the mask image 207 is not acceptable and patterns in the mask variable 203 must be modified.

To determine whether a mask image 207 is acceptable, process P213 may involve determining whether the cost function is reduced or minimized, or whether a given iteration number is reached. For example, an EPE value of a previous iteration may be compared with an EPE value of the current iteration to determine whether the EPE has reduced, minimized, or converged (i.e., no substantial improvement in printed pattern is observed). When the cost function is minimized, the method may stop and the curvilinear mask patterns information that is generated is considered as an optimized result.

However, if the cost function is not reduced or minimized, and the mask related variables or enhanced image related variable (e.g., pixel values) may be updated. In an embodiment, the updating may be based on gradient-based method. For example, if the cost function is not reduced, the method 200 proceeds to a next iteration of generating the mask image after performing processes P215 and P217 that indicate how to further modify the mask variables 203

The process P215 may involve generating a gradient map 215 based on the cost function. The gradient map may be a derivative and/or a partial derivative of the cost function. In an embodiment the partial derivative of the cost function may be determined with respect pixels of the mask image and derivative may be further chained to determine partial derivative with respect to the mask variables 203. Such gradient computation may involve determining inverse relationships between the mask image 207 to the mask variables 203. Furthermore, an inverse relationship of any smoothing operation (or function) performed in process P205 and P203 must be considered.

The gradient map 215 may provide a recommendation about increasing or decreasing the values of the mask variables in a manner such that value of the cost function is reduced, in an embodiment, minimized. In an embodiment, an optimization algorithm may be applied to the gradient map 215 to determine the mask variable values. In an embodiment, an optimization solver may be used to perform gradient-based computation (in process P217).

In an embodiment, for an iteration, mask variables may be changed while the threshold plane may remain fixed or unchanged in order to gradually reduce or minimize the cost function. Thus, the curvilinear patterns generated may gradually evolve during an iteration such that the cost function is reduced, or in an embodiment, minimized. In another embodiment, mask variables as well as the threshold plane may both change to achieve faster convergence of the optimization process. Upon several iterations and/or minimization of the cost function may result in final set of BINARIZED CTM results (i.e., a modified version of the enhanced image, mask image, or curvilinear mask).

In an embodiment of the present disclosure, the transition from CTM optimization with grayscale image to BINARIZED CTM optimization with curvilinear mask may be simplified by replacing the thresholding process (i.e. P203 and P205) by a different process where a sigmoid transformation is applied to the enhanced image 202 and corresponding change in gradient computation is performed. The sigmoid transformation of the enhanced image 202 generates a transformed image that gradually evolve into a curvilinear pattern during an optimization process (e.g., minimizing cost function). During an iteration or a step of optimization, variables (e.g., steepness and/or a threshold) related to sigmoid function may be modified based on the gradient computation. As the sigmoid transformation becomes sharper (e.g., increase in steepness of the slope of the sigmoid transformation) in successive iterations, a gradual transition from the CTM image to a final BINARIZED CTM image may be achieved allowing improved results in the final BINARIZED CTM optimization with curvilinear mask patterns.

In an embodiment of the present disclosure, additional steps/process may be inserted into the loop of an iteration of the optimization, to enforce the result to have selected or desired properties. For example, smoothness may be ensured by adding a smoothing step, or other filter may be used to enforce image to favor horizontal/vertical structures.

The present method has several features or aspects. For example, using an optimized CTM mask image with image enhancement methods to improve the signal which may be further used as seeding in an optimization flow. In another aspect, use of the thresholding method with the CTM technique (referred to as BINARIZED CTM) enables generation of curvilinear mask patterns. In yet another aspect, a full formulation (i.e., a closed loop formulation) of gradient computation also allows using a gradient-based solver for mask variable optimization. The BINARIZED CTM results may be used as a local solution (as hotspot repair) or used as a full chip solution. The BINARIZED CTM results may be used together with machine learning as input. This may allow the use of machine learning to speed up BINARIZED CTM. In yet another aspect, the method includes image regularization methods to improve the results. In another aspect, the method involves successive optimization stages to achieve more smooth transitions from grayscale image CTM to binary curvilinear mask BINARIZED CTM. The method allows tuning the threshold of optimization to improve results. The method includes additional transformation into an iteration of optimization to enforce good property of results (require smoothness in BINARIZED CTM image).

As lithography nodes keep shrinking, more and more complicated masks are required. The present method may be used in key layers with EUV lithographic apparatuses, and/or other lithographic apparatuses. The method according to the present disclosure may be included in different aspect of the mask optimization process including illumination/source mask optimization (SMO), mask optimization, and/or OPC.

For example, a SMO process is described in U.S. Pat. No. 9,588,438, which is incorporated in its entirety by reference. SMO may account for imaging variation across multiple positions of a mask design layout. The design layout may comprise one or more of an entire design layout, a clip, or one or more critical features of the design layout, and/or other layouts. For example, the design layout may be a set of clips that is selected by a pattern selection method based on diffraction signature analysis or any other method. Alternatively, a full chip simulation may be performed, 'hot spots' and/or 'warm spots' may be identified from the full chip simulation, and then a pattern selection step is performed.

Simulating lithography for a lithographic projection apparatus may utilize an illumination/source model that represents optical characteristics (including light intensity distribution and/or phase distribution) of the illumination, a projection optics model that represents optical characteristics (including changes to the light intensity distribution and/or the phase distribution caused by the projection optics) of the projection optics (in some embodiments, the illumination model and the projection optics model can be combined into a transmission cross coefficient (TCC) model), a design layout model that represents optical characteristics (including changes to the light intensity distribution and/or the phase distribution caused by a given design layout) of a design layout, which is the representation of an arrangement of features on a mask, and/or other models. An aerial image can be simulated from the transmission cross coefficient and the design layout model. A resist image can be simulated from the aerial image using a resist model. Simulation of lithography can, for example, predict contours and CDs in the resist image.

In an embodiment, the illumination model can represent the optical characteristics of the illumination that include, but are not limited to, NA-sigma (σ) settings as well as any particular illumination source shape (e.g. off-axis light source shapes such as annular, quadrupole, dipole, etc.). The projection optics model can represent the optical characteristics of the of the projection optics that include aberration, distortion, refractive indexes, physical sizes, physical dimensions, etc. The design layout model can also represent physical properties of a physical mask, as described, for example, in U.S. Pat. No. 7,587,704, which is incorporated by reference in its entirety. The objective of the simulation is to accurately predict, for example, edge placements and CDs, which can then be compared against an intended design. The intended design is generally defined as a pre-OPC design layout which can be provided in a standardized digital file format such as GDSII or OASIS or another file format.

Figure 3A:
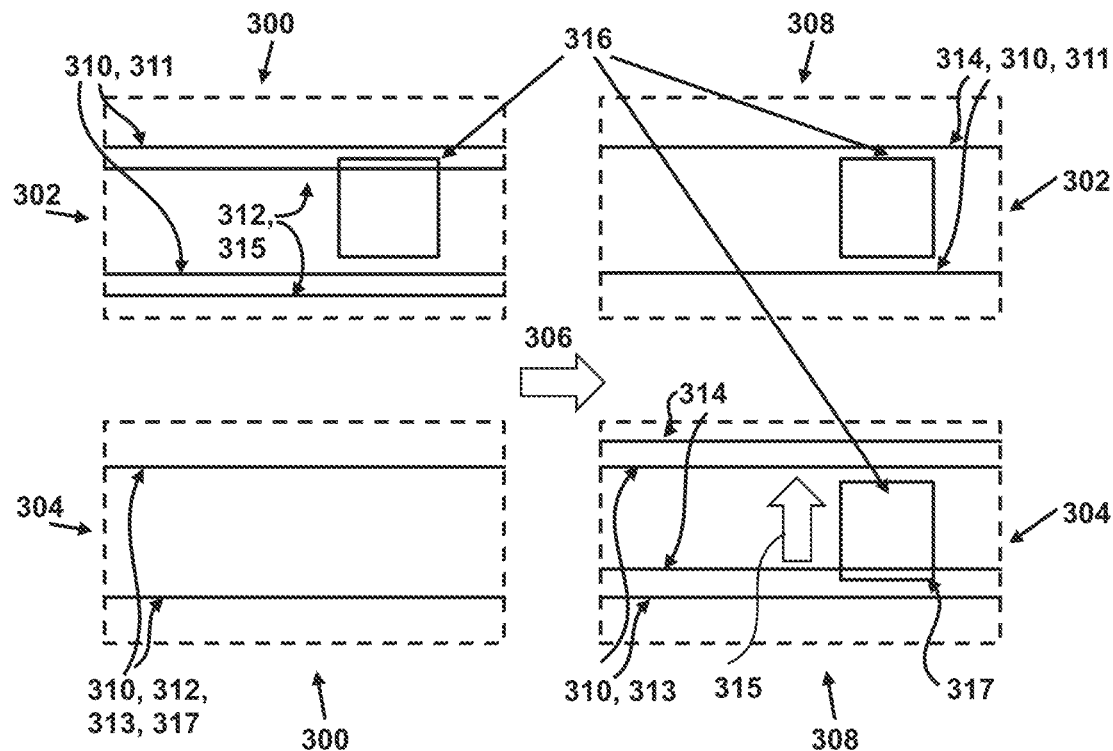
FIG. 3A illustrates a simulated one dimensional device pattern and a one dimensional anchor pattern before exposure, and then device and anchor patterns after exposure as they appear on a substrate or in an aerial image, according to an embodiment.
Figure 3B:
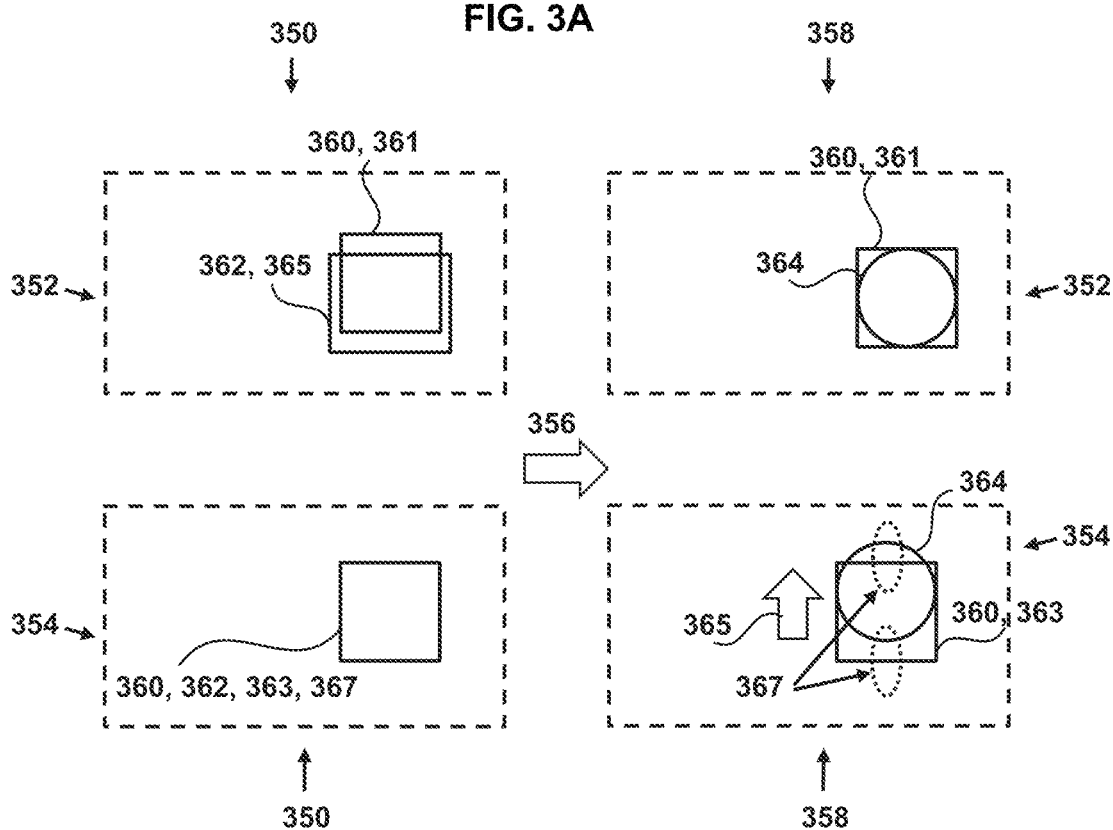
FIG. 3B illustrates a simulated two dimensional device pattern and a two dimensional anchor pattern before exposure, and then device and anchor patterns after exposure as they appear on a substrate or in an aerial image, according to an embodiment.

Referring to FIG. 3A and FIG. 3B, and as described above, the exposure dose impacts lithographic apparatus throughput for imaging operations related to EUV patterning processes. In existing methods, the center of an EUV anchor mask pattern is aligned and fixed to the center of an anchor target pattern. However, a shadow effect between the anchor mask and the anchor target induces a high edge placement (EPE) error and limits process optimization for substrate layer patterns. FIG. 3A illustrates a simulated 300 one dimensional device pattern 302 and a one dimensional anchor pattern 304 before exposure 306, and then device and anchor patterns 302, 304 after exposure 306 as they appear on a substrate 308 (or in an aerial image). The anchor target pattern and the corresponding anchor mask pattern used in SMO are used to set and/or constrain the dose during the SMO process. The anchor target and mask pattern are used as a vehicle for correlating the dose (or threshold) to the physical dose for substrate exposure. During subsequent substrate exposure, the physical dose (mj/cm$^2$) used to expose the anchor pattern mask to print to the target is known. Such a physical exposure dose can be correlated to the SMO dose by the anchor pattern.

FIG. 3A illustrates a target 310 (e.g., a device target pattern 311 and an anchor target pattern 313), a mask 312 (e.g., a device mask 315 and an anchor mask 317), and the resulting contour on a substrate 314 relative to a contact point 316. For device pattern 302, contact point 316 is positioned as intended (target 310 (device target pattern 311) and resulting contour 314 are aligned after exposure 306). Put another way, the pattern is printed on target. However, for anchor pattern 304, where target 310 (anchor target pattern 313) and mask 312 (anchor mask 317) were aligned before exposure 306, the resulting contour 314 has shifted 315 relative to target 310 (anchor target pattern 313). This caused contact point 316 to be misaligned 317 with resulting contour 314.

FIG. 3B illustrates a simulated 350 two dimensional device pattern 352 and a two dimensional anchor pattern 354 before exposure 356, and then device and anchor patterns 352, 354 after exposure 356 as they appear on a substrate 358 (or in an aerial image). FIG. 3B illustrates a target 360 (e.g., a device target pattern 361 and an anchor target pattern 363), a mask 362 (e.g., a device mask 365 and an anchor mask 367), and the resulting contour on a substrate 364 relative to target 360 (device target pattern 361 and anchor target pattern 363). For device pattern 352, contour 364 is positioned as intended; target 360 (device target pattern 361) and resulting contour 364 are aligned after exposure 356. Put another way, the pattern is printed on target. However, for anchor pattern 354, where target 360 (anchor target pattern 363) and mask 362 (anchor mask 367) were aligned before exposure 356, the resulting contour 364 has shifted 365 relative to the target 360 (anchor target pattern 363). This caused misalignment 367 between target 360 (anchor target pattern 363) and resulting contour 364. Since anchor patterns 304 and 354 (FIGS. 3A and 3B) in anchor masks 317 and 367 are not shifted relative to anchor target patterns 313 and 363 before exposures 306 and 356, the resulting contours 314 and 364 are shifted 315 and 365 on the substrate 308, 358. This shift can cause misalignment between layers of a device, restrict process optimization during later manufacturing processes, cause high costs to correct such errors, and/or have other effects, for example.

Allowing the anchor mask pattern to shift relative to the anchor target pattern (or intentionally shifting or biasing the anchor mask pattern relative to the anchor target pattern) while keeping its critical dimension (CD) constant reduces the EPE described above, and restores target features to their intended positions in the anchor target pattern (e.g., compared to a fixed mask/target relationship). The present apparatus and method bias the anchor mask relative to an anchor target (while keeping a CD constant) and set a lower illumination exposure dose (relative to a dose that would be determined with the anchor mask and the anchor target aligned with each other). A dark field mask, for example, increases the anchor mask bias, and reduces the exposure dose, for a fixed photoresist process which requires a fixed amount of photons to clear out the resist in a contact hole. A larger mask bias gives a large area opening and receives more photons. Hence, with a larger opening the dose can be reduced. According to the present method, the anchor mask is un-biased (or realigned with the anchor target), a pupil is optimized for the lower dose, and SMO continues using the lower dose. The present dose reduction SMO method (and apparatus) facilitates maintaining typical normalized image log slope (NILS) and EPE values (among other possibilities), but with a lowered dose and faster lithographic apparatus throughput.

Figure 4A:
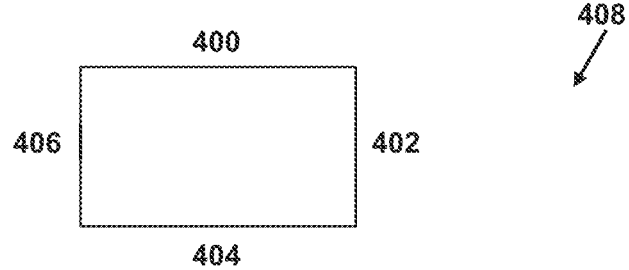
FIG. 4A provides an illustration of an aspect of biasing an anchor mask relative to an anchor target, according to an embodiment.
Figure 4B:
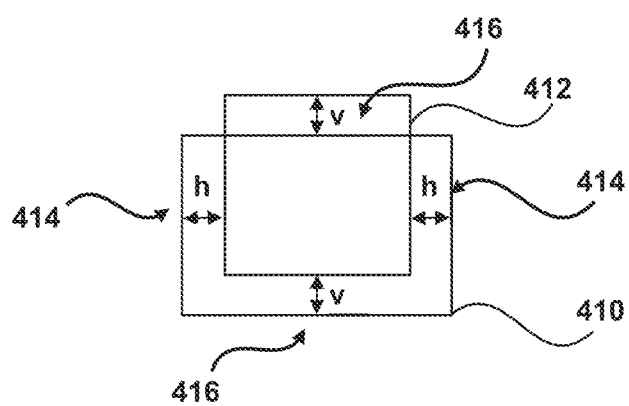
FIG. 4B illustrates biasing an anchor mask relative to an anchor target, according to an embodiment.
Figure 4C:
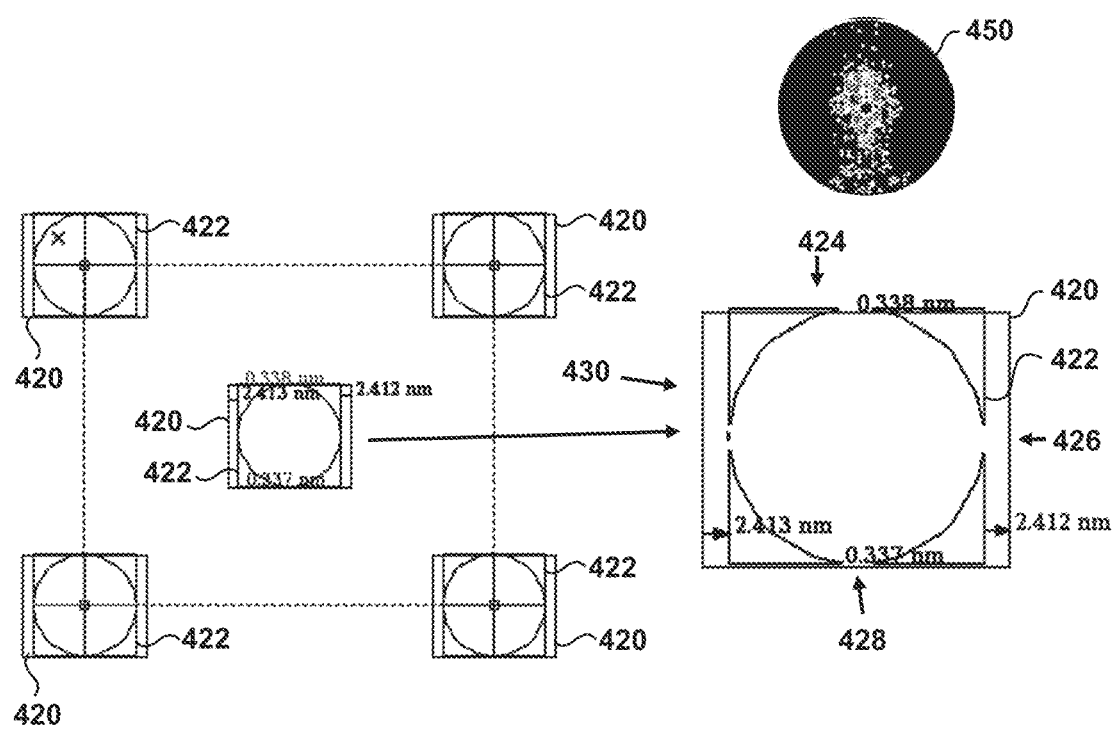
FIG. 4C is another illustration of biasing an anchor mask relative to an anchor target, according to an embodiment.

Biasing a (dose) anchor mask (pattern) relative to a (dose) anchor target (pattern) is illustrated in FIG. 4A, FIG. 4B, and FIG. 4C. In an embodiment, biasing the dose anchor mask pattern relative to the dose anchor target pattern comprises dimensionally shifting the dose anchor mask pattern relative to the dose anchor target pattern in one or more dimensions. In an embodiment, biasing the dose anchor mask pattern relative to the dose anchor target pattern comprises dimensionally shifting one or more edges of one or more features of the dose anchor mask pattern. In an embodiment, the one or more features of the dose anchor mask pattern are one dimensional or two dimensional. In an embodiment, biasing the dose anchor mask pattern relative to the dose anchor target pattern is symmetrical or asymmetrical. In an embodiment, biasing the dose anchor mask pattern relative to the dose anchor target pattern comprises enlarging one or more device patterns and a corresponding mask bias of the device patterns of interest.

For example, as shown in FIG. 4A, one or more edges 400, 402, 404, 406, of one or more features 408 (e.g., a rectangle in this example) of a dose anchor mask pattern (and/or of the whole dose anchor mask itself) may be biased relative to a dose anchor target pattern. Individual edges 400-406 may be biased by the same value (e.g., in the same or opposite directions). Horizontal (in this example) edges 400 and 404 may be biased (e.g., in amount and/or direction) differently compared to vertical edges 402 and 406. Edges 400-406 may be biased individually in amount and/or direction relative to one or more of the other edges. These examples are not intended to be limiting.

As another example, as shown in FIG. 4B, dose anchor mask 410 (and/or a feature of the dose anchor mask pattern) is biased relative to a dose anchor target 412 (and/or a corresponding feature of the dose anchor target pattern). In this example, dose anchor mask 410 is biased in both a horizontal direction 414 and a vertical direction 416 (the use of the terms horizontal and vertical is not intended to be limiting).

As another example, as shown in FIG. 4C, a dose anchor mask 420 (and/or a feature of the dose anchor mask pattern) is biased asymmetrically relative to a dose anchor target 422 (and/or a corresponding feature of the dose anchor target pattern). In this example, a first edge 424 is biased by 0.338 nm, a second edge 426 is biased by 2.412 nm, a third edge 428 is biased by 0.337 nm, and a fourth edge 430 is biased by 2.413 nm. FIG. 4C also illustrates a changed or optimized pupil 450 configuration determined based on an acceptable lower dose determined with dose anchor mask 420 biased relative to dose anchor target 422 (where the pupil configuration is determined with dose anchor mask 420 back in an unbiased position relative to dose anchor target 422—e.g., put back in its original dimensional position).

Figure 5A:
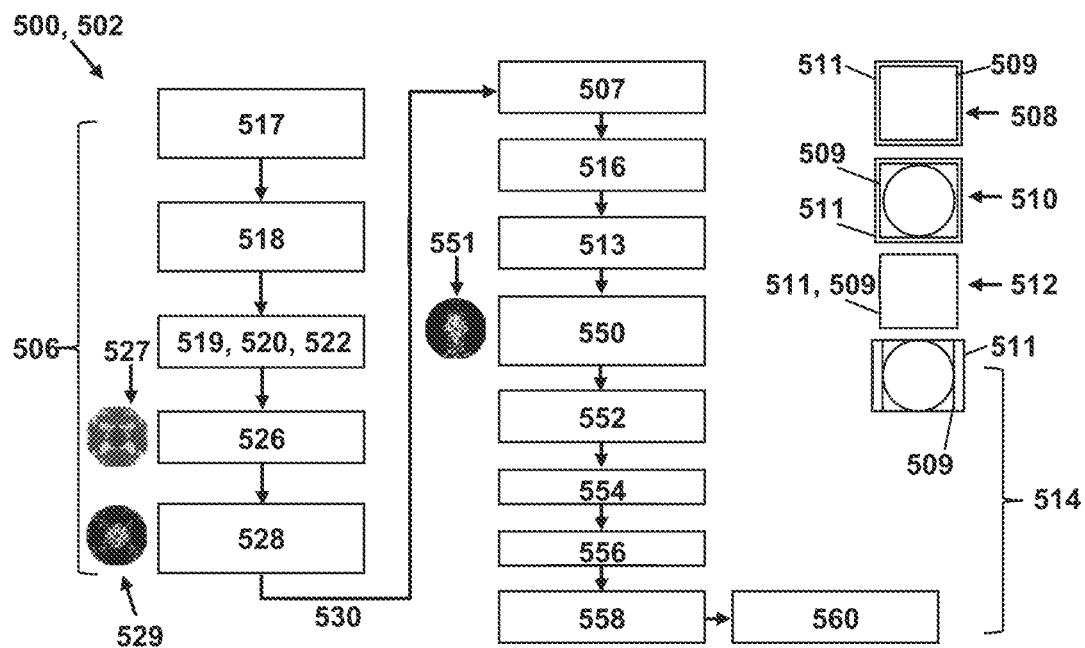
FIG. 5A illustrates an embodiment of the present method for configuring an EUV lithographic apparatus for SMO to increase scanner throughput, according to an embodiment.
Figure 5B:
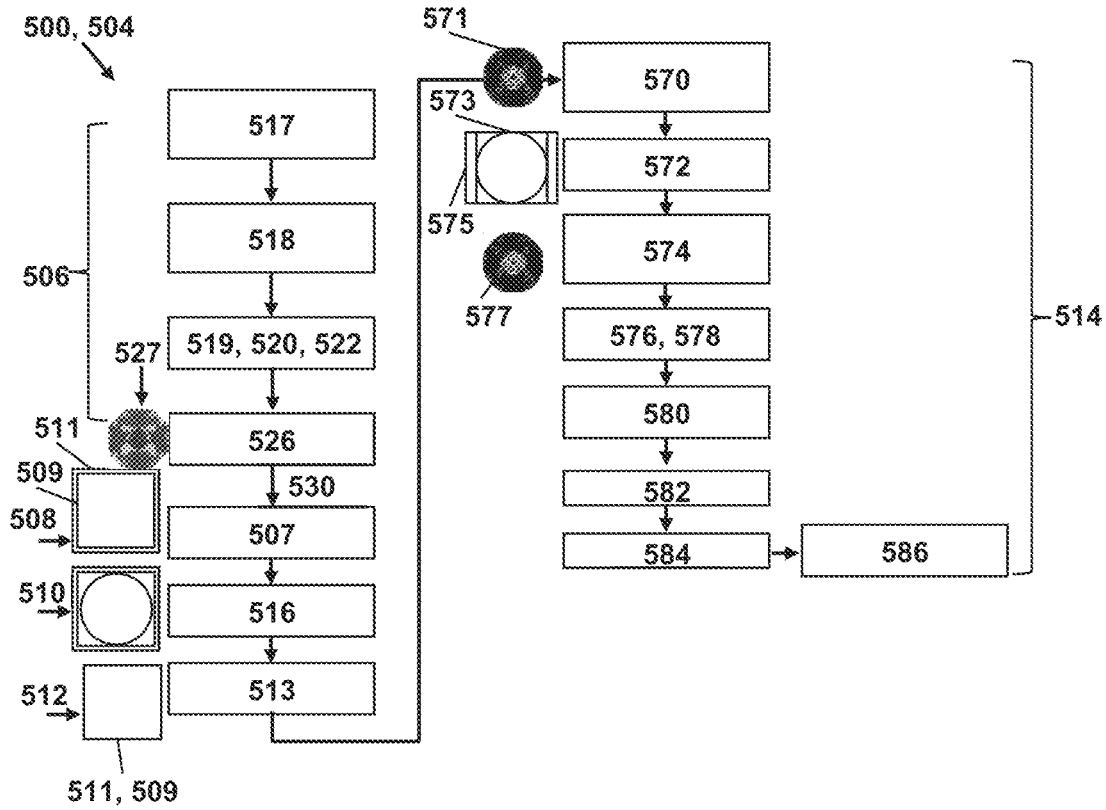
FIG. 5B illustrates another embodiment of the present method for configuring the EUV lithographic apparatus for SMO to increase scanner throughput, according to an embodiment.

Embodiments of the method 500 for configuring an EUV lithographic apparatus for SMO configured to increase lithographic apparatus throughput is illustrated in FIGS. 5A and 5B. FIGS. 5A and 5B illustrate example embodiments 502 and 504 of the present method (e.g., the methods shown in FIGS. 5A and 5B are slight variations of each other). As shown in FIGS. 5A and 5B, the method comprises providing 506 a baseline dose for an EUV illumination and an initial pupil configuration. The baseline dose and the initial pupil configuration are configured for use with a dose anchor mask pattern and a corresponding dose anchor target pattern for setting an illumination dose for corresponding device patterns of interest. In an embodiment, the baseline dose and the initial pupil configuration are configured for use with the dose anchor mask pattern and the corresponding dose anchor target pattern for setting the dose for corresponding optimized device patterns of interest.

Method 500 comprises biasing 508 the dose anchor mask pattern relative to the dose anchor target pattern. For example, operation 508 may include biasing 507 an anchor mask +x nm to facilitate dose reduction. An anchor target 509 and a biased anchor mask 511 are also illustrated in connection with operation 508.

Method 500 comprises determining 510 an acceptable lower dose for the biased dose anchor mask pattern and the initial pupil configuration. Method 500 comprises un-biasing 512 the dose anchor mask pattern relative to the dose anchor target pattern. For example, operation 512 may include un-biasing 513 an anchor mask −x nm. Anchor target 509 and un-biased anchor mask 511 (along with a corresponding resulting contour) are also illustrated in connection with operation 512. Method 500 comprises determining 514 a changed pupil configuration and a mask bias for the device patterns of interest based on the acceptable lower dose and the unbiased dose anchor mask pattern.

In some embodiments (e.g., 502 and 504), determining 510 the acceptable lower dose for the biased dose anchor mask pattern and the initial pupil configuration comprises a dose and focus optimization 516. In an embodiment (e.g., 502), providing 506 the baseline dose for the EUV illumination and the initial pupil configuration comprises: obtaining an initial model with an initial dose 517; setting up an anchor clip target, an anchor clip mask, and device clips 518; optimizing a freeform or parametric pupil and the dose anchor mask pattern 519 (considering the thin mask approximation and/or the mask 3D effect (M3D)); optimizing a continuous transmission mask (CTM) and extracting main and assist features 520; optimizing pupil and polygon masks at different dose levels 522 (e.g., using Lp Norm with different Norm values (e.g., power 2 and power 4 or higher)); performing a dose and focus optimization 526 (showing an example pupil 527); converting 528 a discrete pupil 529 (e.g., mapped from a continuous pupil 527 according to an EUV system design (pupil max intensity normalized to 1)); and determining the baseline dose and the initial pupil configuration based on the dose and focus optimization and providing the baseline dose for the EUV illumination and the initial pupil configuration 530.

In an embodiment (e.g., 504), providing 506 the baseline dose for the EUV illumination and the initial pupil configuration comprises: obtaining the initial model with the initial dose 517; setting up the anchor clip target, the anchor clip mask, and the device clips 518; optimizing the freeform or parametric pupil and the dose anchor mask pattern 519 (considering the thin mask approximation and/or the mask 3D effect (M3D)); optimizing the continuous transmission mask (CTM) and extracting main and assist features 520; optimizing the pupil and polygon masks at different dose levels 522 (e.g., using Lp Norm with different Norm values (e.g., power 2 and power 4 or higher)); performing dose and focus optimization 526 (showing an example pupil 527); and determining the baseline dose and the initial pupil configuration based on the dose and focus optimization and providing the baseline dose for the EUV illumination and the initial pupil configuration 530.

In an embodiment (e.g., 502), method 500 further comprises, after determining the changed pupil configuration and the mask bias for the device patterns of interest (e.g., operation 514 comprises) performing 550 a discrete mirror state optimization at the acceptable lower dose, or a higher dose (e.g., a discrete pupil optimization at a fixed dose threshold (e.g., the acceptable lower dose determined as described above)). This method can also be used to optimize a process where the LER or LCDU is too large and causing hotspots. This method can be used with an optimized minimum amount of dose increase to meet the LER or LCDU specification. An example pupil 551 associated with operation 550 is also illustrated. Embodiment 502 of method 500 includes optimizing 552 the acceptable lower dose based on a difference between Abbe and Hopkins model outputs; optimizing 554 the mask bias for the device patterns of interest through one or more exposure slits using the optimized acceptable lower dose, or the higher dose; performing 556 OPC; generating 558 a final lithographic apparatus throughput model based on the acceptable reduced dose; and determining 560 lithographic apparatus throughput based on the optimized acceptable lower dose and the relative lithographic apparatus throughput model.

In an embodiment (e.g., 504), method 500 further comprises, after determining the changed pupil configuration based on the acceptable lower dose, or the higher dose, and the unbiased dose anchor mask pattern (e.g., operation 514 comprises): normalizing 570 an intensity of the EUV illumination to optimize a free form illumination mask co-optimization 572 with a fixed dose and a fixed illumination intensity set at the acceptable lower dose, or the higher dose, with a pupil telecentricity penalty (an example pupil 571, an example target/contour 573, and an example mask 575 are also illustrated); converting 574 a continuous pupil produced by the changed pupil configuration to a discrete pupil 577

(e.g., using an EUV illumination renderer); performing 576 a dose and focus optimization using a dose anchor feature and a focus anchor feature, simultaneously or sequentially; performing 578 a mask only optimization of the device patterns of interest with the discrete pupil at the acceptable lower dose; optimizing 580 the acceptable lower dose based on a difference between Abbe and Hopkins model outputs; optimizing 582 the mask bias for the device patterns of interest through one or more exposure slits using the optimized acceptable lower dose; performing 584 OPC; and determining 586 lithographic apparatus throughput based on the optimized acceptable lower dose and a relative lithographic apparatus throughput model.

In an embodiment, providing the baseline dose for the EUV illumination and the initial pupil configuration 506, biasing the dose anchor mask pattern relative to the dose anchor target pattern 508, determining the acceptable lower dose for the biased dose anchor mask pattern and the initial pupil configuration 510, un-biasing the dose anchor mask pattern relative to the dose anchor target pattern 512, and determining the changed pupil configuration and the mask bias for the device patterns of interest based on the acceptable lower dose and the unbiased dose anchor mask pattern 514 are performed for an aerial image.

In an embodiment, providing the baseline dose for the EUV illumination and the initial pupil configuration 506, biasing the dose anchor mask pattern relative to the dose anchor target pattern 508; determining the acceptable lower dose for the biased dose anchor mask pattern and the initial pupil configuration 510; un-biasing the dose anchor mask pattern relative to the dose anchor target pattern 512; and determining the changed pupil configuration and the mask bias for the device patterns of interest based on the acceptable lower dose and the unbiased dose anchor mask pattern 514 are performed for a resist image.

In an embodiment, providing the baseline dose for the EUV illumination and the initial pupil configuration 506, biasing the dose anchor mask pattern relative to the dose anchor target pattern 508, determining the acceptable lower dose for the biased dose anchor mask pattern and the initial pupil configuration 510, un-biasing the dose anchor mask pattern relative to the dose anchor target pattern 512, and determining the changed pupil configuration and the mask bias for the device patterns of interest based on the acceptable lower dose and the unbiased dose anchor mask pattern 514 are performed at any numerical aperture and/or wavelength.

In an embodiment, providing the baseline dose for the EUV illumination and the initial pupil configuration 506, biasing the dose anchor mask pattern relative to the dose anchor target pattern 508, determining the acceptable lower dose for the biased dose anchor mask pattern and the initial pupil configuration 510, un-biasing the dose anchor mask pattern relative to the dose anchor target pattern 512, and determining the changed pupil configuration and the mask bias for the device patterns of interest based on the acceptable lower dose and the unbiased dose anchor mask pattern 514 are performed as part of a memory chip, logic chip, and/or microprocessor chip fabrication process.

In an embodiment, providing the baseline dose for the EUV illumination and the initial pupil configuration 506, biasing the dose anchor mask pattern relative to the dose anchor target pattern 508, determining the acceptable lower dose for the biased dose anchor mask pattern and the initial pupil configuration 510, un-biasing the dose anchor mask pattern relative to the dose anchor target pattern 512, and determining the changed pupil configuration and the mask bias for the device patterns of interest based on the acceptable lower dose and the unbiased dose anchor mask pattern 514 are performed as part of one or more SMO processes (e.g. the same as, similar to, and/or different than the SMO illustrated in FIG. 5A and/or FIG. 5B).

In an embodiment, determining the acceptable lower dose (e.g., 510) comprises determining an amount of bias in one or more directions for a given anchor mask and/or feature of an anchor mask pattern such that one or more performance parameters are maintained at an acceptable level. In an embodiment, biasing the dose anchor mask pattern relative to the dose anchor target pattern 508, determining the acceptable lower dose for the biased dose anchor mask pattern and the initial pupil configuration 510, un-biasing the dose anchor mask pattern relative to the dose anchor target pattern 512, and determining the changed pupil configuration and the mask bias for the device patterns of interest based on the acceptable lower dose and the unbiased dose anchor mask pattern 514 are performed such that the one or more performance parameters are maintained at acceptable levels.

In an embodiment, the performance parameters are one or more selected from: normalized image log slope (NILS), depth of focus (DOF), line edge roughness (LER), stochastic edge placement error (SEPE), and/or one or more other performance parameters. In some embodiments, the one or more performance parameters may be entered and/or selected by a user (e.g., via a computing system as described below). The one or more performance parameters may be determined at manufacture of the present apparatus, determined based on prior patterning processes, and/or determined in other ways.

Figure 6A:
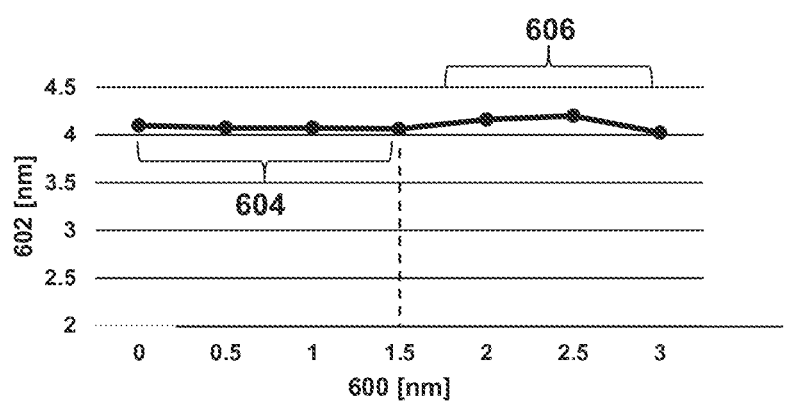
FIG. 6A illustrates how determining an acceptable lower dose comprises determining an amount of bias in one or more directions for a given anchor mask and/or feature of an anchor mask pattern such that a first performance parameter is maintained at an acceptable level, according to an embodiment.
Figure 6B:
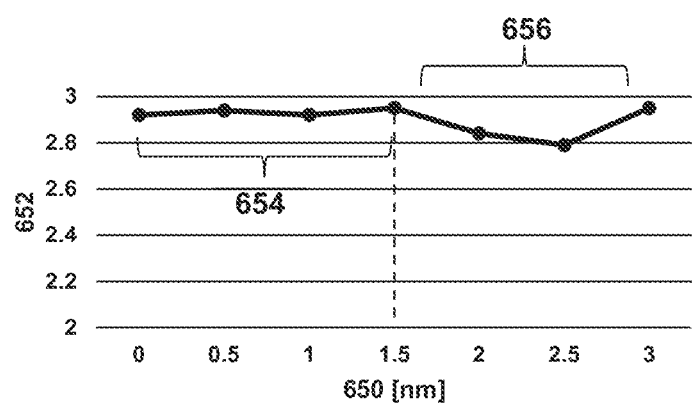
FIG. 6B illustrates how determining the acceptable lower dose comprises determining the amount of bias in one or more directions for the given anchor mask and/or feature of an anchor mask pattern such that a second performance parameter is maintained at an acceptable level, according to an embodiment.

FIG. 6A and FIG. 6B illustrate how determining the acceptable lower dose comprises determining an amount of bias in one or more directions for a given anchor mask and/or feature of an anchor mask pattern such that one or more performance parameters are maintained at an acceptable level. Since the amount of bias and the amount the dose can be lowered for a given bias are related as described above, the acceptable lower dose includes any (lowered) dose that corresponds to any given amount of bias that keeps the one or more performance parameters within an acceptable range. The means that the acceptable lower dose may have a range of values. In an embodiment, the acceptable lower dose may be the (lowest) dose that corresponds to a maximum amount of bias that keeps the one or more performance parameters within an acceptable range.

For example, FIG. 6A illustrates an amount of anchor mask bias 600 (in nm) versus SEPE 602 (in nm). As shown in FIG. 6A, SEPE 602 remains relatively unchanged 604 for bias values from 0-1.5 nm. However, after 1.5 nm, SEPE 602 shows more variation 606. In this example, variation 606 in SEPE 602 may breach an acceptable range for SEPE 602, indicating that the acceptable lower dose corresponds to 1.5 nm (or less) of bias 600.

As another example, FIG. 6B illustrates an amount of anchor mask bias 650 (in nm) versus NILS 652. As shown in FIG. 6B, similar to SEPE 602 in FIG. 6A, NILS 652 remains relatively unchanged 654 for bias values from 0-1.5 nm. However, after 1.5 nm, NILS 652 shows more variation 656. In this example, variation 656 in NILS 652 may breach an acceptable range for NILS 652, indicating that the acceptable lower dose corresponds to 1.5 nm (or less) of bias 650.

Returning to FIG. 5A and FIG. 5B, in an embodiment, as described above, method 500 comprises determining a lithographic apparatus throughput for a lithographic apparatus associated with the EUV apparatus (e.g., 560 and 586). In an embodiment, the lithographic apparatus throughput is determined based on a relative throughput model. The relative throughput model comprises one or more machine specific constants, a transmission penalty, an illumination/source power, the acceptable lower dose (or higher dose), the baseline dose, and a relative change between the baseline dose and the acceptable lower dose (or the higher dose). In an embodiment, the relative throughput model is and/or includes the following algorithm:

$$rTPT_{set} = \frac{3600}{C_1 + \frac{C_2}{\text{Transmission penalty} * \left(\frac{\text{Power}}{\text{dose}}\right) * \left(\frac{\text{thres}}{\text{thres\_baseline}}\right)}}$$

The algorithm shown above defines a relative substrate throughput based on the dose. According to the algorithm shown above, as the dose is reduced, the relative throughput increases. As shown in the algorithm, relative throughput for a given dose setting ($rTPT_{set}$) depends on EUV lithographic apparatus machine specific constants $C_1$ and $C_2$, a transmission penalty, the illumination/source power, the dose (e.g., the acceptable lower dose described above), and a threshold/threshold baseline factor. The lithographic apparatus throughput is reported as substrates per hour (e.g., 3600 seconds). The machine specific constants may be related to lithographic apparatus scan speed (C1), illumination/source power (C2), and/or one or more other characteristics. The power/dose term has the units of (substrate area)/second, which is related to the lithographic apparatus speed. The threshold/threshold baseline (thres/thres_baseline) term represents, the relative dose reduction ratio which leads to relative throughput improvement. For an aerial image example, the threshold=1/dose such that the higher the threshold, the lower the dose. The lower the dose the higher the lithographic apparatus throughtput (thres/thres_baseline=(1/dose)/(1/dose_baseline)).

Figure 7:
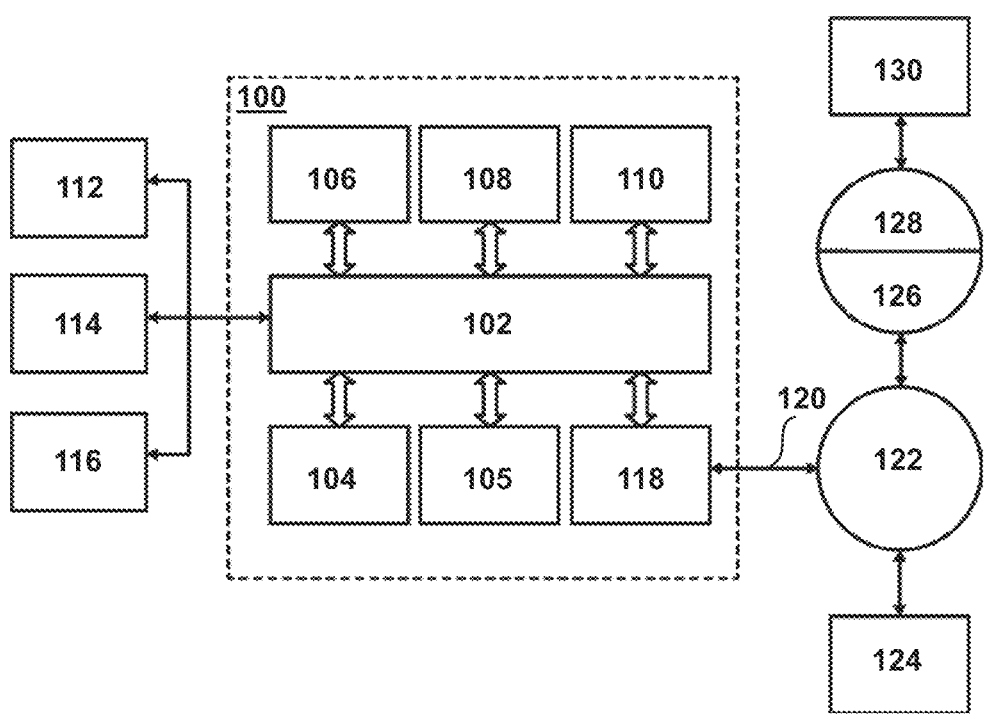
FIG. 7 is a block diagram of an example computer system, according to an embodiment.

FIG. 7 is a block diagram that illustrates a computer system 100 that can assist in implementing the methods, flows, or the apparatus disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform one or more of the method/process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer (e.g., a server and/or other computing devices), a solid-state storage device, and/or in other locations. The remote computer can load the instructions into its dynamic memory and send the instructions over a wireless communication network (e.g., the internet, a cellular communications network, etc.), through a telephone line using a modem, and/or by other methods. A modem and/or other data receiving components local to computer system 100 can receive the data via the wireless communication network, on the telephone line, etc., and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide all or part of a method described herein, for example. The received code may be executed by processor 104 as it is received, and/or stored in storage device 110, or other non-volatile storage for later execution. In this manner, computer system 100 may obtain application code in the form of a carrier wave.

Figure 8:
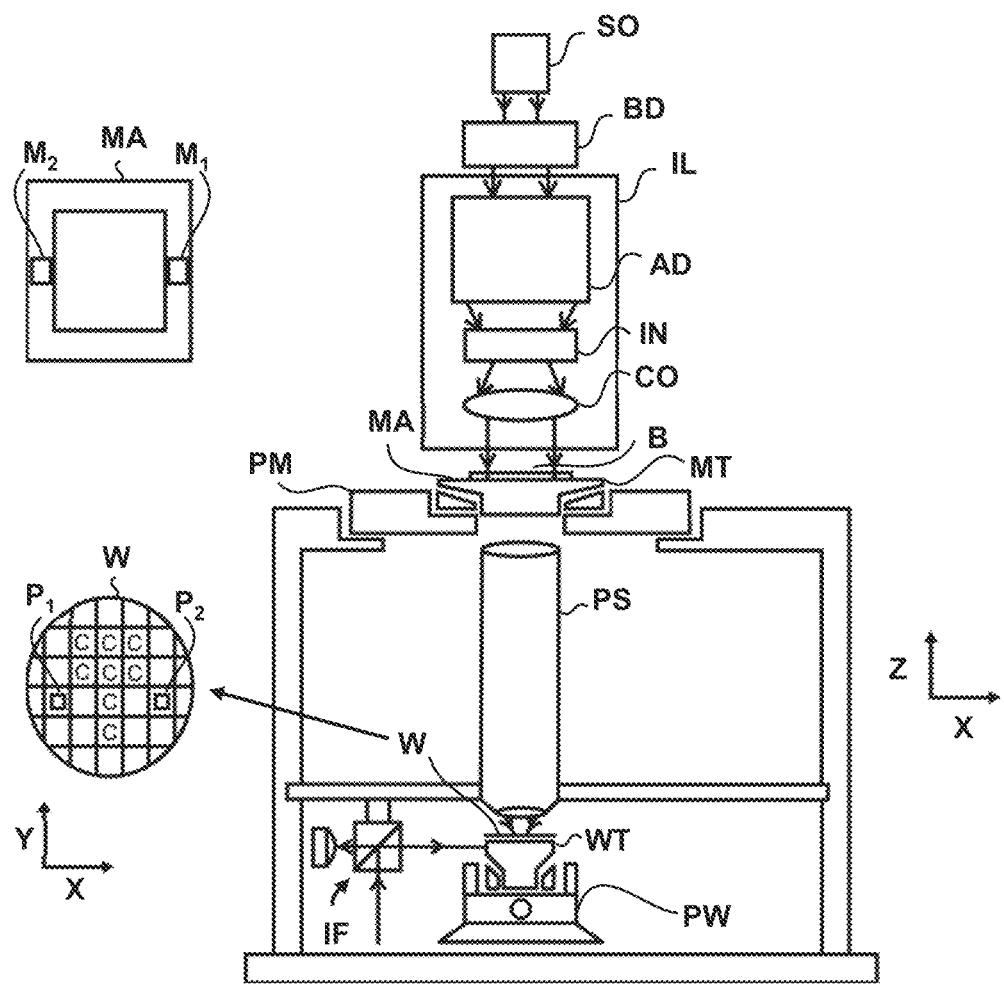
FIG. 8 is a schematic diagram of a lithographic projection apparatus, according to an embodiment.

FIG. 8 schematically depicts an exemplary lithographic projection apparatus that may be utilized in conjunction with the techniques described herein. The apparatus comprises:
- an illumination system IL, to condition a beam B of radiation. In this particular case, the illumination system also comprises a radiation source apparatus SO;
- a first object table (e.g., patterning device table) MT provided with a patterning device holder to hold a patterning device MA (e.g., a reticle), and connected to a first positioner to accurately position the patterning device with respect to item PS;
- a second object table (substrate table) WT provided with a substrate holder to hold a substrate W (e.g., a resist-coated silicon wafer), and connected to a second positioner to accurately position the substrate with respect to item PS; and
- a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device relative to classic mask; examples include a programmable mirror array or LCD matrix.

The source apparatus SO (e.g., a mercury lamp or excimer laser, LPP (laser produced plasma), a free electron laser, or other EUV source apparatus) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 8 that the source apparatus SO may be within the housing of the lithographic projection apparatus (as is often the case when the source apparatus SO is a mercury lamp, for example), but that it may also be remote from the lithographic projection apparatus, the radiation beam that it produces being led into the apparatus (e.g., with the aid of suitable directing mirrors). This latter scenario is often the case when the source apparatus SO is an excimer laser (e.g., based on KrF, ArF or $F_2$ lasing).

The beam B subsequently intercepts the patterning device MA, which is held on a patterning device table MT. Having traversed the patterning device MA, the beam B passes through the lens PS, which focuses the beam B onto a target portion C of the substrate W. With the aid of the second positioning means (and interferometric measuring means IF), the substrate table WT can be moved accurately, e.g. so as to position different target portions C in the path of the beam B. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 8. However, in the case of a stepper (as opposed to a step-and-scan tool) the patterning device table MT may just be connected to a short stroke actuator, or may be fixed.

The depicted tool can be used in two different modes:
- In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 9:
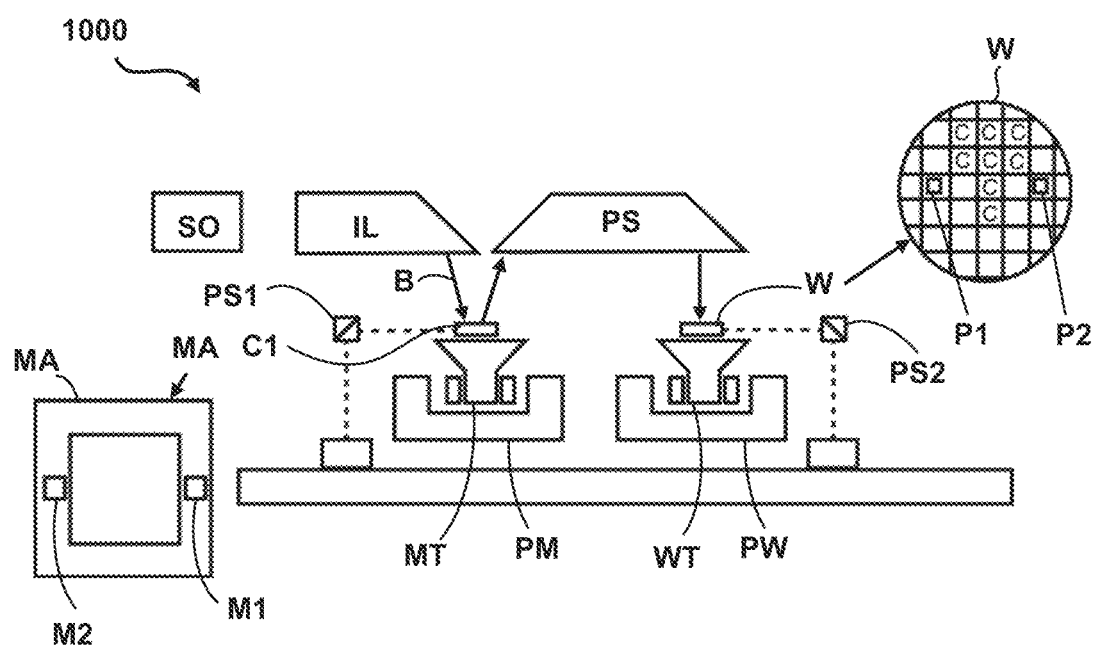
FIG. 9 is a schematic diagram of another lithographic projection apparatus, according to an embodiment.

FIG. 9 schematically depicts another exemplary lithographic projection apparatus 1000 that can be utilized in conjunction with the techniques described herein.

The lithographic projection apparatus 1000 comprises:
- a source collector module SO
- an illumination system (illuminator) IL configured to condition a radiation beam B (e.g. EUV radiation).
- a support structure (e.g. a patterning device table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist coated wafer) W and connected to a second positioner PW configured to accurately position the substrate; and
- a projection system (e.g. a reflective projection system) PS configured to project a pattern imparted to the radiation beam B by patterning device MA onto a target portion C1 (e.g. comprising one or more dies) of the substrate W.

As depicted in FIG. 9, the apparatus 1000 is of a reflective type (e.g. employing a reflective patterning device). It is to be noted that because most materials are absorptive within the EUV wavelength range, the patterning device may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

The illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 9, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases, the source apparatus may be an integral part of the source collector module, for example when the source apparatus is a discharge produced plasma EUV generator, often termed as a DPP source apparatus. In an embodiment, a DUV laser may be used.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

In step mode, the support structure (e.g. patterning device table) MT and the substrate table WT are kept essentially stationary, while an entire pattern imparted to the radiation beam is projected onto a target portion C1 at one time (i.e. a single static exposure). The substrate table WT is then shifted in the X and/or Y direction so that a different target portion C1 can be exposed.

In scan mode, the support structure (e.g. patterning device table) MT and the substrate table WT are scanned synchronously while a pattern imparted to the radiation beam is projected onto a target portion C1 (i.e. a single dynamic exposure). The velocity and direction of the substrate table WT relative to the support structure (e.g. patterning device table) MT may be determined by the (de-)magnification and image reversal characteristics of the projection system PS.

In another mode, the support structure (e.g. patterning device table) MT is kept essentially stationary holding a programmable patterning device, and the substrate table WT is moved or scanned while a pattern imparted to the radiation beam is projected onto a target portion C1. In this mode, generally a pulsed radiation source apparatus is employed, and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 10:
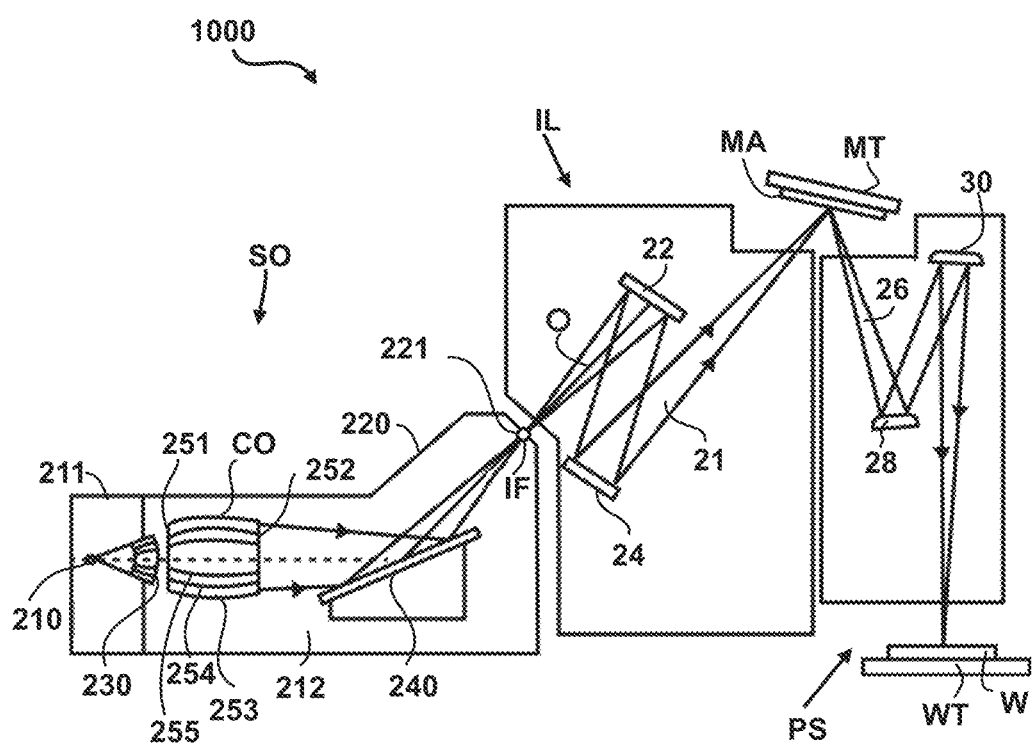
FIG. 10 is a more detailed view of the apparatus in FIG. 9, according to an embodiment.

FIG. 10 shows the apparatus 1000 in more detail, including the source collector module SO, the illumination system IL, and the projection system PS. The source collector module SO is configured such that a vacuum environment can be maintained in an enclosing structure 220 of the source collector module SO. An EUV radiation emitting plasma 210 may be formed by a discharge produced plasma source apparatus (and/or other source apparatuses as described above). EUV radiation may be produced by a gas or vapor, for example Xe gas, Li vapor or Sn vapor in which the hot plasma 210 is created to emit radiation in the EUV range of the electromagnetic spectrum. The hot plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-10 or more additional reflective elements present in the projection system PS than shown in FIG. 10.

Collector optic CO, as further illustrated in FIG. 10, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source apparatus, often called a DPP source apparatus.

Figure 11:
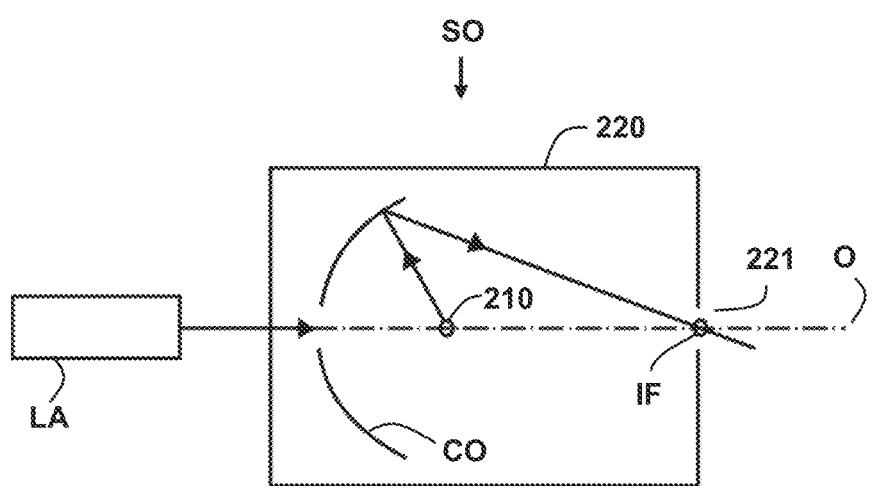
FIG. 11 is a more detailed view of the source collector module SO of the apparatus of FIG. 9 and FIG. 10, according to an embodiment.

Alternatively, the source collector module SO may be part of an LPP radiation system as shown in FIG. 11. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method for configuring an extreme ultra violet (EUV) lithographic apparatus, the method comprising:
providing a baseline dose for an EUV source and an initial pupil configuration, wherein the baseline dose and the initial pupil configuration are configured for use with a dose anchor mask pattern and a corresponding dose anchor target pattern for setting a source dose for corresponding device patterns of interest;
biasing the dose anchor mask pattern relative to the dose anchor target pattern;
determining an acceptable lower dose for the biased dose anchor mask pattern and the initial pupil configuration;
unbiasing the dose anchor mask pattern relative to the dose anchor target pattern; and
determining a changed pupil configuration and a mask bias for the device patterns of interest based on the acceptable lower dose and the unbiased dose anchor mask pattern.

2. The method of clause 1, wherein biasing the dose anchor mask pattern relative to the dose anchor target pattern comprises dimensionally shifting the dose anchor mask pattern relative to the dose anchor target pattern in one or more dimensions.

3. The method of clause 1 or clause 2, wherein biasing the dose anchor mask pattern relative to the dose anchor target pattern comprises dimensionally shifting one or more edges of one or more features of the dose anchor mask pattern.

4. The method of clause 3, wherein the one or more features of the dose anchor mask pattern are one dimensional or two dimensional.

5. The method of any of clauses 1-4, wherein biasing the dose anchor mask pattern relative to the dose anchor target pattern is symmetrical or asymmetrical.

6. The method of any of clauses 1-5, wherein biasing the dose anchor mask pattern relative to the dose anchor target pattern comprises enlarging one or more device patterns and a corresponding mask bias of the device patterns of interest.

7. The method of any of clauses 1-6, wherein determining the acceptable lower dose for the biased dose anchor mask pattern and the initial pupil configuration comprises a dose and focus optimization.

8. The method of any of clauses 1-7, wherein providing the baseline dose for the EUV source and the initial pupil configuration comprises:
optimizing a freeform or parametric pupil and the dose anchor mask pattern;
optimizing a continuous transmission mask (CTM) and extracting main and assist features;
optimizing pupil and polygon masks at different dose levels;
mapping a discrete pupil;
performing a dose and focus optimization;
determining the baseline dose and the initial pupil configuration based on the dose and focus optimization; and
providing the baseline dose for the EUV source and the initial pupil configuration.

9. The method of any of clauses 1-7, further comprising, after determining the changed pupil configuration and the mask bias for the device patterns of interest:
performing a discrete mirror state optimization at the acceptable lower dose, or a higher dose;
optimizing the acceptable lower dose based on a difference between Abbe and Hopkins model outputs;
optimizing the mask bias for the device patterns of interest through slits using the optimized acceptable lower dose, or the higher dose; and determining scanner throughput based on the optimized acceptable lower dose and a relative scanner throughput model.

10. The method of clause 8 or clause 9, further comprising, after determining the changed pupil configuration based on the acceptable lower dose, or the higher dose, and the unbiased dose anchor mask pattern:

normalizing an intensity of the EUV source to optimize a free form source mask co-optimization with a fixed dose and a fixed source intensity set at the acceptable lower dose, or the higher dose, with a pupil telecentricity penalty;

mapping a continuous pupil produced by the changed pupil configuration to a discrete pupil;

performing a dose and focus optimization using a dose anchor feature and a focus anchor feature, simultaneously or sequentially;

performing a mask only optimization of the device patterns of interest with the discrete pupil at the acceptable lower dose;

optimizing the acceptable lower dose based on a difference between Abbe and Hopkins model outputs;

optimizing the mask bias for the device patterns of interest through slits using the optimized acceptable lower dose; and determining scanner throughput based on the optimized acceptable lower dose and a relative scanner throughput model.

11. The method of any of clauses 1-10, wherein providing the baseline dose for the EUV source and the initial pupil configuration, biasing the dose anchor mask pattern relative to the dose anchor target pattern, determining the acceptable lower dose for the biased dose anchor mask pattern and the initial pupil configuration, unbiasing the dose anchor mask pattern relative to the dose anchor target pattern, and determining the changed pupil configuration and the mask bias for the device patterns of interest based on the acceptable lower dose and the unbiased dose anchor mask pattern are performed for an aerial image model.

12. The method of any of clauses 1-11, wherein providing the baseline dose for the EUV source and the initial pupil configuration, biasing the dose anchor mask pattern relative to the dose anchor target pattern; determining the acceptable lower dose for the biased dose anchor mask pattern and the initial pupil configuration; unbiasing the dose anchor mask pattern relative to the dose anchor target pattern; and determining the changed pupil configuration and the mask bias for the device patterns of interest based on the acceptable lower dose and the unbiased dose anchor mask pattern are performed for a resist image model.

13. The method of any of clauses 1-12, wherein providing the baseline dose for the EUV source and the initial pupil configuration, biasing the dose anchor mask pattern relative to the dose anchor target pattern, determining the acceptable lower dose for the biased dose anchor mask pattern and the initial pupil configuration, unbiasing the dose anchor mask pattern relative to the dose anchor target pattern, and determining the changed pupil configuration and the mask bias for the device patterns of interest based on the acceptable lower dose and the unbiased dose anchor mask pattern are performed at any numerical aperture and/or wavelength.

14. The method of any of clauses 1-13, wherein providing the baseline dose for the EUV source and the initial pupil configuration, biasing the dose anchor mask pattern relative to the dose anchor target pattern, determining the acceptable lower dose for the biased dose anchor mask pattern and the initial pupil configuration, unbiasing the dose anchor mask pattern relative to the dose anchor target pattern, and determining the changed pupil configuration and the mask bias for the device patterns of interest based on the acceptable lower dose and the unbiased dose anchor mask pattern are performed as part of a memory chip, logic chip, and/or microprocessor chip fabrication process.

15. The method of any of clauses 1-14, wherein providing the baseline dose for the EUV source and the initial pupil configuration, biasing the dose anchor mask pattern relative to the dose anchor target pattern, determining the acceptable lower dose for the biased dose anchor mask pattern and the initial pupil configuration, unbiasing the dose anchor mask pattern relative to the dose anchor target pattern, and determining the changed pupil configuration and the mask bias for the device patterns of interest based on the acceptable lower dose and the unbiased dose anchor mask pattern are performed as part of a source mask optimization (SMO) process.

16. The method of any of clauses 1-15, wherein biasing the dose anchor mask pattern relative to the dose anchor target pattern, determining the acceptable lower dose for the biased dose anchor mask pattern and the initial pupil configuration, unbiasing the dose anchor mask pattern relative to the dose anchor target pattern, and determining the changed pupil configuration and the mask bias for the device patterns of interest based on the acceptable lower dose and the unbiased dose anchor mask pattern are performed such that a performance parameter is maintained at an acceptable level.

17. The method of clause 16, wherein the performance parameter is one or more of normalized image long slope (NILS), depth of focus (DOF), line edge roughness (LER), local CD uniformity (LCDU), or stochastic edge placement error (SEPE).

18. The method of any of clauses 1-17, further comprising determining a scanner throughput for a scanner associated with the EUV lithographic apparatus.

19. The method of clause 18, wherein the scanner throughput is determined based on a relative throughput model comprising one or more machine specific constants, a transmission penalty, a source power, the acceptable lower or a higher dose, the baseline dose, and a relative change between the baseline dose and the acceptable lower dose, or a higher dose.

20. The method of any of clauses 1-19, wherein the baseline dose and the initial pupil configuration are configured for use with the dose anchor mask pattern and the corresponding dose anchor target pattern for setting the source dose for corresponding optimized device patterns of interest.

21. A computer program product comprising a non-transitory computer readable medium having instructions recorded thereon, the instructions when executed by a computer implementing the method of any of clauses 1-20.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet) patterning processes. EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

What is claimed is:

1. A method for configuring an extreme ultra violet (EUV) lithographic apparatus, the method comprising:
providing a baseline dose for an EUV illumination and an initial pupil configuration, wherein the baseline dose and the initial pupil configuration are configured for use with a dose anchor mask pattern and a corresponding dose anchor target pattern for setting an illumination dose for corresponding device patterns of interest;
biasing the dose anchor mask pattern relative to the dose anchor target pattern;
determining a dose lower than the baseline dose, for the biased dose anchor mask pattern and the initial pupil configuration;
unbiasing the dose anchor mask pattern relative to the dose anchor target pattern; and
determining a changed pupil configuration and a mask bias for the device patterns of interest based on the lower dose, or a higher dose than the lower dose, and the unbiased dose anchor mask pattern.

2. A computer program product comprising a non-transitory computer readable medium having instructions therein, the instructions, when executed by a computer system, configured to cause the computer system to at least:
obtain a baseline dose for an illumination and an initial pupil configuration, wherein the baseline dose and the initial pupil configuration are configured for use with a dose anchor mask pattern and a corresponding dose anchor target pattern for setting an illumination dose for corresponding device patterns of interest;
bias the dose anchor mask pattern relative to the dose anchor target pattern;
determine a dose lower than the baseline dose, for the biased dose anchor mask pattern and the initial pupil configuration;
unbias the dose anchor mask pattern relative to the dose anchor target pattern; and
determine a changed pupil configuration and a mask bias for the device patterns of interest based on the lower dose, or a higher dose than the lower dose, and the unbiased dose anchor mask pattern implement the method of claim 1.

3. The computer program product of claim 2, wherein the instructions configured to cause the computer system to bias the dose anchor mask pattern relative to the dose anchor target pattern are further configured to cause the computer system to dimensional shift the dose anchor mask pattern relative to the dose anchor target pattern in one or more dimensions.

4. The computer program product of claim 2, wherein the instructions configured to cause the computer system to bias the dose anchor mask pattern relative to the dose anchor target pattern are further configured to cause the computer system to dimensionally shift one or more edges of one or more features of the dose anchor mask pattern.

5. The computer program product of claim 4, wherein the one or more features of the dose anchor mask pattern are one dimensional or two dimensional.

6. The computer program product of claim 2, wherein the instructions configured to cause the computer system to bias the dose anchor mask pattern relative to the dose anchor target pattern are further configured to cause the computer system to bias the dose anchor mask pattern relative to the dose anchor target pattern asymmetrically.

7. The computer program product of claim 2, wherein the instructions configured to cause the computer system to bias the dose anchor mask pattern relative to the dose anchor target pattern are further configured to cause the computer system to enlarge one or more device patterns and provide a corresponding mask bias of the device patterns of interest.

8. The computer program product of claim 2, wherein the instructions configured to cause the computer system to determine the lower dose for the biased dose anchor mask pattern and the initial pupil configuration are further configured to cause the computer system to do so using a dose and focus optimization.

9. The computer program product of claim 2, wherein the instructions configured to cause the computer system to obtain the baseline dose and the initial pupil configuration are further configured to cause the computer system to:
optimize a freeform or parametric pupil and the dose anchor mask pattern;
optimize a continuous transmission mask (CTM) and extracting main and assist features;
optimize pupil and polygon masks at different dose levels;
map a discrete pupil;
perform a dose and focus optimization;
determine the baseline dose and the initial pupil configuration based on the dose and focus optimization; and
provide the baseline dose for the illumination and the initial pupil configuration.

10. The computer program product of claim 2, wherein the instructions are further configured to cause the computer system to, after determination of the changed pupil configuration:
normalize an intensity of the illumination to optimize a free form illumination mask co-optimization with a fixed dose and a fixed illumination intensity set at the lower dose, or a dose higher than the lower dose, with a pupil telecentricity penalty;
map a continuous pupil produced by the changed pupil configuration to a discrete pupil;
perform a dose and focus optimization using a dose anchor feature and a focus anchor feature, simultaneously or sequentially;
perform a mask only optimization of device patterns of interest with the discrete pupil;
optimize dose based on a difference between Abbe and Hopkins model outputs; and
optimize the mask bias for device patterns of interest through a slit using the optimized dose, or a dose higher than the optimized dose.

11. The computer program product of claim 2, wherein the instructions are further configured to cause the computer system to, after determination of the changed pupil configuration:
perform a discrete mirror state optimization at the lower dose, or a dose higher than the lower dose;
optimize dose based on a difference between Abbe and Hopkins model outputs; and
optimize the mask bias for device patterns of interest through a slit using the optimized dose, or a dose higher than the optimized dose.

12. The computer program product of claim 2, wherein the instructions configured to cause the computer system to obtain the baseline dose and the initial pupil configuration, bias the dose anchor mask pattern, determine the lower dose, unbias the dose anchor mask pattern, and determine the changed pupil configuration and the mask bias are configured to do so using an aerial image model.

13. The computer program product of claim 2, wherein the instructions configured to cause the computer system to obtain the baseline dose and the initial pupil configuration, bias the dose anchor mask pattern, determine the lower dose, unbias the dose anchor mask pattern, and determine the changed pupil configuration and the mask bias are configured to do so for a resist image model.

14. The computer program product of claim 2, wherein the instructions configured to cause the computer system to obtain the baseline dose and the initial pupil configuration, bias the dose anchor mask pattern, determine the lower dose, unbias the dose anchor mask pattern, and determine the changed pupil configuration and the mask bias are configured to do so at any numerical aperture and/or wavelength.

15. The computer program product of claim 2, wherein the instructions configured to cause the computer system to obtain the baseline dose and the initial pupil configuration, bias the dose anchor mask pattern, determine the lower dose, unbias the dose anchor mask pattern, and determine the changed pupil configuration and the mask bias are configured to do so as part of a memory chip, logic chip, and/or microprocessor chip fabrication process.

16. The computer program product of claim 2, wherein the instructions configured to cause the computer system to obtain the baseline dose and the initial pupil configuration, bias the dose anchor mask pattern, determine the lower dose, unbias the dose anchor mask pattern, and determine the changed pupil configuration and the mask bias are configured to do so as part of an illumination mask optimization (SMO) process.

17. The computer program product of claim 2, wherein the instructions configured to cause the computer system to obtain the baseline dose and the initial pupil configuration, bias the dose anchor mask pattern, determine the lower dose, unbias the dose anchor mask pattern, and determine the changed pupil configuration and the mask bias are configured to do so such that a performance parameter is maintained at a certain value or within a certain range.

18. The computer program product of claim 17, wherein the performance parameter is one or more selected from: normalized image log slope (NILS), depth of focus (DOF), line edge roughness (LER), local CD uniformity (LCDU), or stochastic edge placement error (SEPE).

19. The computer program product of claim 2, wherein the instructions are further configured to cause the computer system to determine a lithographic apparatus throughput for a lithographic apparatus to provide the illumination.

20. The computer program product of claim 19, wherein the instructions are further configured to cause the computer system to determine the lithographic apparatus throughput based on a relative throughput model comprising one or more machine specific constants, a transmission penalty, an illumination power, the lower dose or a higher dose than the lower dose, the baseline dose, and a relative change between the baseline dose and the lower or higher dose.

21. The computer program product of claim 2, wherein the baseline dose and the initial pupil configuration are configured for use with the dose anchor mask pattern and the corresponding dose anchor target pattern for setting the illumination dose for corresponding optimized device patterns of interest.

22. A computer program product comprising a non-transitory computer readable medium having instructions therein, the instructions, when executed by a computer system, configured to cause the computer system to at least:
  obtain a baseline dose for an EUV illumination and an initial pupil configuration, wherein the baseline dose and the initial pupil configuration are configured for use with a dose anchor mask pattern and a corresponding dose anchor target pattern for setting an illumination dose for corresponding device patterns of interest;
  bias the dose anchor mask pattern relative to the dose anchor target pattern;
  determine a dose lower than the baseline dose, for the biased dose anchor mask pattern and the initial pupil configuration;
  unbias the dose anchor mask pattern relative to the dose anchor target pattern; and
  determine a changed pupil configuration and a mask bias for the device patterns of interest based on the lower dose, or a higher dose than the lower dose, and the unbiased dose anchor mask pattern.

* * * * *